(12) United States Patent
Yamazaki

(10) Patent No.: US 8,840,972 B2
(45) Date of Patent: Sep. 23, 2014

(54) DEPOSITION METHOD AND METHOD FOR MANUFACTURING LIGHT-EMITTING DEVICE

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1060 days.

(21) Appl. No.: 12/396,636

(22) Filed: Mar. 3, 2009

(65) Prior Publication Data
US 2009/0226637 A1  Sep. 10, 2009

(30) Foreign Application Priority Data

Mar. 7, 2008  (JP) .................................. 2008-057356
Mar. 7, 2008  (JP) .................................. 2008-057359

(51) Int. Cl.
| | |
|---|---|
| B05D 3/00 | (2006.01) |
| C08J 7/18 | (2006.01) |
| C23C 14/30 | (2006.01) |
| C23C 14/04 | (2006.01) |
| C23C 14/28 | (2006.01) |

(52) U.S. Cl.
CPC ................ C23C 14/048 (2013.01); C23C 14/28 (2013.01)
USPC ............ 427/561; 427/554; 427/555; 427/596

(58) Field of Classification Search
CPC ............. B01J 2219/00441; B01J 2219/00527; B01J 2219/00596; B01J 2219/0075; C23C 14/048; C23C 14/28; H01L 2221/68363; B82Y 30/00; B82Y 20/00
USPC ............... 156/272.2, 278, 279; 427/180, 202, 427/212, 214, 215, 218, 372.2, 532, 553, 427/554, 555, 557, 558, 559, 561, 596
See application file for complete search history.

(56) References Cited

U.S. PATENT DOCUMENTS 4,970,196 A  *  11/1990  Kim et al. ...................... 505/474
4,987,006 A  *  1/1991  Williams et al. .............. 427/597
(Continued)

FOREIGN PATENT DOCUMENTS

| | | |
|---|---|---|
| EP | 1 176 642 A2 | 1/2002 |
| EP | 1 335 637 A1 | 8/2003 |

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

*Primary Examiner* — Michael Wieczorek
(74) *Attorney, Agent, or Firm* — Husch Blackwell LLP

(57) ABSTRACT

An object is to provide a deposition method of forming a film in a minute pattern on a deposition target substrate as well as reducing waste of material and increasing material use efficiency. Another object is to manufacture a high-definition light-emitting device at low cost by such a deposition method. Particles containing an organic compound material are dispersed over a deposition substrate having a light-absorbing layer formed over the deposition substrate and are fixed by heat treatment to form a material layer. The light-absorbing layer is irradiated with light which is transmitted through the deposition substrate, so that a material contained in the material layer is selectively deposited onto a deposition target substrate placed facing the deposition substrate. By selective formation of the light-absorbing layer, a film can be selectively deposited in a minute pattern reflecting a pattern of the light-absorbing layer onto the deposition target substrate.

38 Claims, 21 Drawing Sheets

(56) References Cited

U.S. PATENT DOCUMENTS

| | | | |
|---|---|---|---|
| 5,171,650 A * | 12/1992 | Ellis et al. | 430/20 |
| 5,380,390 A * | 1/1995 | Tselesin | 156/230 |
| 5,695,592 A * | 12/1997 | Rouaud et al. | 156/279 |
| 5,851,709 A | 12/1998 | Grande et al. | |
| 5,937,272 A | 8/1999 | Tang | |
| 6,165,543 A | 12/2000 | Otsuki et al. | |
| 6,177,151 B1 * | 1/2001 | Chrisey et al. | 427/596 |
| 6,283,060 B1 | 9/2001 | Yamazaki et al. | |
| 6,555,284 B1 | 4/2003 | Boronson et al. | |
| 6,566,032 B1 | 5/2003 | Boroson et al. | |
| 6,610,455 B1 | 8/2003 | Burberry et al. | |
| 6,689,492 B1 | 2/2004 | Yamazaki et al. | |
| 6,695,029 B2 | 2/2004 | Phillips et al. | |
| 6,703,179 B2 | 3/2004 | Tyan | |
| 6,776,847 B2 | 8/2004 | Yamazaki et al. | |
| 6,776,880 B1 | 8/2004 | Yamazaki | |
| 6,811,938 B2 | 11/2004 | Tutt et al. | |
| 6,890,627 B2 | 5/2005 | Culver et al. | |
| 7,015,154 B2 | 3/2006 | Yamazaki et al. | |
| 7,179,756 B2 | 2/2007 | Yamazaki et al. | |
| 7,265,489 B2 | 9/2007 | Yamasaki et al. | |
| 7,288,420 B1 | 10/2007 | Yamazaki et al. | |
| 7,316,983 B2 | 1/2008 | Yamazaki et al. | |
| 7,378,711 B2 | 5/2008 | Suh et al. | |
| 7,994,021 B2 | 8/2011 | Miyairi et al. | |
| 2001/0006827 A1 | 7/2001 | Yamazaki et al. | |
| 2002/0094385 A1 * | 7/2002 | Raychaudhuri et al. | 427/385.5 |
| 2002/0197393 A1 * | 12/2002 | Kuwabara | 427/66 |
| 2004/0065902 A1 | 4/2004 | Yamazaki et al. | |
| 2004/0130596 A1 | 7/2004 | Liu et al. | |
| 2004/0191564 A1 | 9/2004 | Kim et al. | |
| 2004/0206307 A1 | 10/2004 | Boroson et al. | |
| 2004/0217695 A1 | 11/2004 | Yoneda et al. | |
| 2005/0005848 A1 | 1/2005 | Yamazaki et al. | |
| 2005/0145326 A1 | 7/2005 | Hatwar | |
| 2005/0157157 A1 | 7/2005 | Tsukamoto et al. | |
| 2006/0243377 A1 | 11/2006 | Matsuo et al. | |
| 2006/0246240 A1 | 11/2006 | Matsuda et al. | |
| 2006/0246693 A1 | 11/2006 | Tanaka et al. | |
| 2007/0267953 A1 | 11/2007 | Seki | |
| 2008/0026543 A1 * | 1/2008 | Miyairi et al. | 438/455 |
| 2008/0050851 A1 | 2/2008 | Tanaka et al. | |
| 2008/0050895 A1 | 2/2008 | Miyairi et al. | |
| 2008/0057632 A1 | 3/2008 | Arai et al. | |
| 2008/0081115 A1 | 4/2008 | Yamazaki et al. | |
| 2008/0124850 A1 | 5/2008 | Takayama et al. | |
| 2008/0182349 A1 | 7/2008 | Yamazaki et al. | |
| 2008/0227232 A1 | 9/2008 | Yamazaki et al. | |
| 2008/0233272 A1 | 9/2008 | Ibe et al. | |
| 2008/0260938 A1 | 10/2008 | Ikeda et al. | |
| 2008/0268135 A1 | 10/2008 | Yokoyama et al. | |
| 2008/0268137 A1 | 10/2008 | Ikeda et al. | |
| 2008/0268561 A1 | 10/2008 | Ikeda et al. | |
| 2008/0299496 A1 | 12/2008 | Hirakata et al. | |
| 2008/0305287 A1 | 12/2008 | Ohata et al. | |
| 2009/0011677 A1 | 1/2009 | Ikeda et al. | |
| 2009/0197017 A1 | 8/2009 | Tanaka et al. | |
| 2009/0220706 A1 | 9/2009 | Yamazaki et al. | |
| 2009/0233006 A1 | 9/2009 | Yamazaki et al. | |
| 2011/0275191 A1 | 11/2011 | Miyairi et al. | |

FOREIGN PATENT DOCUMENTS

| | | |
|---|---|---|
| EP | 1 387 418 A2 | 2/2004 |
| JP | 2000-256877 | 9/2000 |
| JP | 2002-343566 | 11/2002 |
| JP | 2003-77661 | 3/2003 |
| JP | 2003-229259 | 8/2003 |
| JP | 2004-71551 | 3/2004 |
| JP | 2004-103406 | 4/2004 |
| JP | 2004-214167 | 7/2004 |
| JP | 2006-113568 | 4/2006 |
| JP | 2006-202510 | 8/2006 |
| JP | 2006-228649 | 8/2006 |
| JP | 2006-244944 | 9/2006 |
| JP | 2008-53698 | 3/2008 |

\* cited by examiner

FIG. 4A
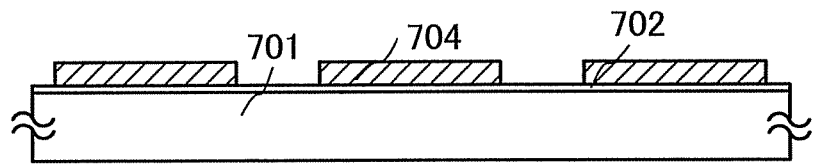
FIG. 4B
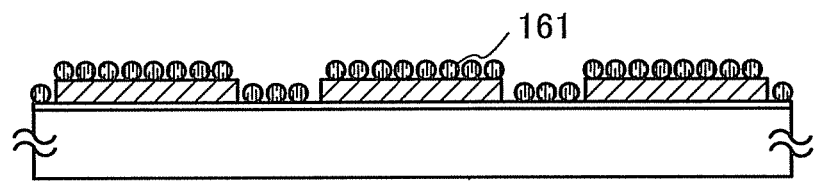
FIG. 4C
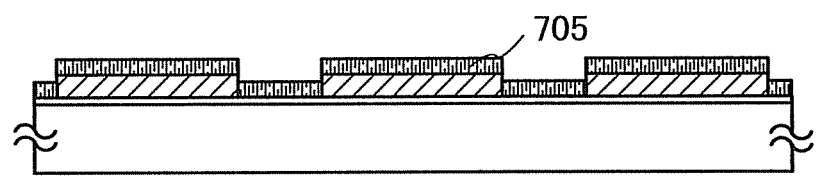
FIG. 4D
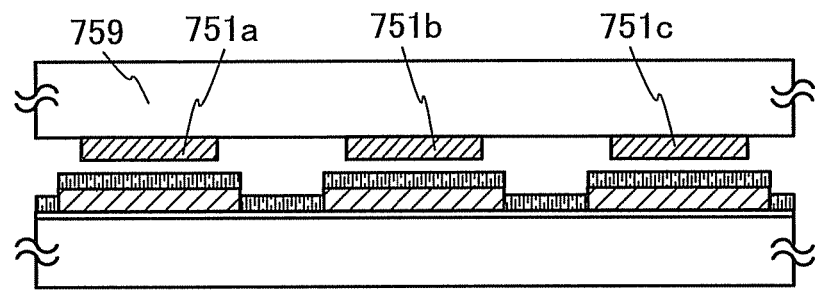
FIG. 4E
FIG. 4F
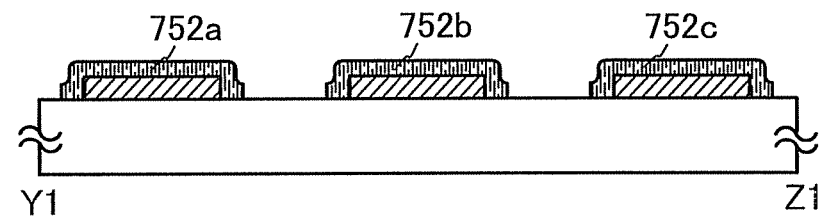

DEPOSITION METHOD AND METHOD FOR MANUFACTURING LIGHT-EMITTING DEVICE

BACKGROUND OF THE INVENTION

1. Field of the Invention

The present invention relates to a deposition method and a method for manufacturing a light-emitting device.

2. Description of the Related Art

In a light-emitting device provided with an electroluminescent (hereinafter also referred to as EL) element, a color light-emitting element which emits color light is used in order to perform full-color display. In order to form the color light-emitting element, a light-emitting material of each color should be formed in a minute pattern over an electrode.

In general, a light-emitting material is deposited by an evaporation method. However, an evaporation method has problems such as low material use efficiency and limitation on substrate size, and thus it is unsuitable for industrialization in which high productivity at low cost is required.

As a technique for solving the above-described problems, a variety of wet processes have been proposed (for example, see Patent Document 1: Japanese Published Patent Application No. 2002-343566 and Patent Document 2: Japanese Published Patent Application No. 2003-077661).

In Patent Document 1, a colloid solution in which aggregations of organic compounds are dispersed is sprayed to form a film containing the aggregations of organic compounds over a substrate. In Patent Document 2, a colloid solution in which aggregations of organic compounds are dispersed is uniformly dispersed to form a film containing the aggregations of organic compounds over a substrate.

SUMMARY OF THE INVENTION

It is an object of the present invention to provide a deposition method in which waste of material is reduced to increase material use efficiency and a thin film in a minute pattern is formed over a deposition target substrate. It is another object to form a light-emitting element by such a deposition method and manufacture a high-definition light-emitting device at low cost.

In the present invention, a deposition substrate in which a light-absorbing layer and a material layer are formed over a substrate is irradiated with light and the light is transmitted through the substrate to be emitted to the light-absorbing layer, so that a material contained in the material layer is selectively deposited onto a deposition target substrate which is placed so as to face the deposition substrate. By selective formation of the light-absorbing layer, a film can be selectively deposited in a minute pattern reflecting a pattern of the light-absorbing layer onto the deposition target substrate. The material layer is formed in such a manner that particles containing an organic compound material are dispersed over the substrate and the light-absorbing layer and are fixed onto the light-absorbing layer by heat treatment. When the particles containing an organic compound material are melted by the heat treatment, they can be fixed onto the light-absorbing layer as the material layer in a film form.

Alternatively, the material layer may be formed in such a manner that the particles containing an organic compound material are dispersed over the substrate and the light-absorbing layer and are selectively subjected to heat treatment to be fixed onto the light-absorbing layer. By selective formation of both the light-absorbing layer and the material layer, a film can be selectively deposited in a minute pattern reflecting a pattern of the light-absorbing layer onto the deposition target substrate.

In the case where heat treatment is selectively performed only on the particles over the light-absorbing layer, of the particles containing an organic compound material which have been dispersed over the first substrate and the light-absorbing layer, the particles over the first substrate can be removed and collected. The collected particles containing an organic compound material can be reused in a deposition process. Alternatively, the particles containing an organic compound material can be removed by spraying of an inert gas such as nitrogen.

Note that in this specification, a substrate onto which a thin film is formed in a minute pattern is denoted as a "deposition target substrate" and a substrate which provides a material to be formed on the deposition target substrate is denoted as a "deposition substrate".

An embodiment of a deposition method of the present invention includes steps of selectively forming a light-absorbing layer over a first substrate; dispersing particles containing an organic compound material over the first substrate and the light-absorbing layer; fixing the particles containing an organic compound material at least onto the light-absorbing layer by heating, thereby forming a deposition substrate; placing the deposition substrate and a deposition target substrate so that a surface of the deposition substrate over which the light-absorbing layer is formed and a deposition target surface of the deposition target substrate face each other; irradiating the light-absorbing layer with light after passing through the first substrate; and depositing the organic compound material over the light-absorbing layer onto the deposition target substrate.

Another embodiment of a deposition method of the present invention includes steps of selectively forming a light-absorbing layer over a first substrate; dispersing particles containing an organic compound material over the first substrate and the light-absorbing layer; fixing the particles containing an organic compound material onto the first substrate and the light-absorbing layer by heating to form a material layer over the first substrate and the light-absorbing layer, thereby forming a deposition substrate; placing the deposition substrate and a deposition target substrate so that a surface of the deposition substrate over which the material layer is formed and a deposition target surface of the deposition target substrate face each other; and by irradiating the light-absorbing layer with light after passing through the first substrate, depositing the material layer over the light-absorbing layer onto the deposition target substrate.

Another embodiment of a deposition method of the present invention includes steps of selectively forming a light-absorbing layer over a first substrate; dispersing particles containing an organic compound material over the first substrate and the light-absorbing layer; fixing the particles containing an organic compound onto the light-absorbing layer by selective heating of the particles containing an organic compound material over the light-absorbing layer over the first substrate, thereby forming a material layer over the light-absorbing layer; removing and collecting the particles containing an organic compound material over the first substrate, which have not been fixed, to form a deposition substrate; placing the deposition substrate and a deposition target substrate so that a surface of the deposition substrate over which the material layer is formed and a deposition target surface of the deposition target substrate face each other; and by irradiating the light-absorbing layer with light after passing through the first substrate, depositing the material layer over the light-absorbing layer onto the deposition target substrate.

In the above-described structures, the deposition target substrate may be placed above the deposition substrate so that the surface of the deposition substrate over which the material layer is formed and the deposition target surface of the deposition target substrate face each other.

In the present invention, a thin film in a minute pattern can be formed onto the deposition target substrate without providing a minute mask for separating pixels between the material and the deposition target substrate.

In the present invention, as in the above-described structures, the particles containing an organic compound material are dispersed and fixed to form the material layer over the deposition substrate, and light irradiation is performed from the lower side of the deposition substrate to deposit the material contained in the material layer onto the deposition target substrate which is placed above. Thus, the deposition substrate can be placed with the material layer side facing upwards (also referred to as so called "face-up placement") throughout the deposition process. Since the deposition substrate does not need to be placed with the material layer facing downwards (also referred to as so called "face-down placement") during the process, contamination of the material layer due to dust or the like during the process can be reduced. In this case, the term "downwards" means the direction in which an object falls naturally.

The step of heating the particles containing an organic compound material is preferably performed in a nitrogen or rare gas atmosphere. The nitrogen or rare gas atmosphere can prevent impurities in the air, such as water, from being mixed into a film. In addition, when nitrogen or a rare gas is made to flow, impurities or extra particles containing an organic compound material can be removed and collected.

The step of selectively heating the particles containing an organic compound material over the light-absorbing layer can be performed using the light-absorbing layer. The step can be preferably performed by irradiation of the light-absorbing layer with light. Alternatively, the step may be performed by selective heating of the light-absorbing layer by a heater or the like.

The step of irradiating the light-absorbing layer with light is preferably performed under reduced pressure. When the irradiation with light is performed under reduced pressure to deposit the material onto the deposition target substrate, an effect of contaminants such as dust on a film which is to be deposited can be reduced. Alternatively, the step of irradiating the light-absorbing layer with light may be performed when the material layer is in a heating state (a state in which the material layer has heat). If heat treatment is performed on the material layer to make the material layer in a heating state (a state in which the material layer has heat), the material contained in the material layer can be deposited onto the deposition target substrate even by light irradiation using a light source of light with low power. Further, if the material layer is in a heating state, a margin of a light irradiation condition can be enlarged.

The step of dispersing the particles containing an organic compound material over the first substrate and the light-absorbing layer which serve as the deposition substrate is preferably performed using a mask for covering an edge of the first substrate. If the material layer is formed over the edge of the first substrate, when the edge of the substrate is held by a transfer unit for transferring the substrate and when the substrate is set in a batch or the like, the material might be attached to and contaminate the transfer unit or the batch. Further, in the case where an alignment marker is formed at the edge of the first substrate, the marker cannot be identified if the material layer is formed over the marker. Therefore, the particles dispersed over the edge of the substrate are preferably blocked by the mask. The particles blocked by the mask can be collected easily and reused for deposition. Thus, material use efficiency can be significantly increased. In addition, if the particles are collected in a particulate state, a special purification step or the like does not need to be performed.

Since the step of dispersing the particles containing an organic compound material can be performed under atmospheric pressure, facilities such as a vacuum apparatus can be reduced. Moreover, since the size of a substrate to be processed is not limited by the size of a vacuum chamber, it is possible to respond to use of a larger substrate to increase an area to be processed, whereby low cost and increase in productivity can be achieved.

Laser light of which repetition rate is greater than or equal to 10 MHz and pulse width is greater than or equal to 100 fs and less than or equal to 10 ns can be used as the light. With use of such laser light whose pulse width is very small, thermal conversion in the light-absorbing layer is efficiently performed, and thus the material can be efficiently heated. Further, since the laser light of which repetition rate is greater than or equal to 10 MHz and pulse width is greater than or equal to 100 fs and less than or equal to 10 ns is capable of short-time irradiation, diffusion of heat can be suppressed, and thus a minute pattern can be deposited. In addition, since the laser light of which repetition rate is greater than or equal to 10 MHz and pulse width is greater than or equal to 100 fs and less than or equal to 10 ns is capable of a high output, a large area can be processed at a time. Further, the laser light is shaped into linear or rectangular laser light on an irradiation surface, so that a substrate to be processed can be efficiently scanned with the laser light. Thus, time taken for deposition (takt time) is shortened, which leads to increase in productivity.

The particles containing an organic compound material are dispersed and fixed to form the material layer, and the material layer is deposited onto a first electrode formed on the deposition target surface of the deposition target substrate, so that a light-emitting element can be formed. An EL layer can be formed in a minute pattern on the deposition target substrate, and deposition can be performed for each emission color. A high-definition light-emitting device including such a light-emitting element can be manufactured.

When the present invention is used, a thin film can be formed on a large-area deposition target substrate; thus, a large light-emitting device and electronic device can be manufactured.

In the present invention, a thin film in a minute pattern can be formed on a deposition target substrate without providing a minute mask for separating pixels between the material and the deposition target substrate. In addition, waster of material can be reduced to increase material use efficiency, and thus reduction in cost is possible. Moreover, a light-emitting element can be formed by such a deposition method, and accordingly a high-definition light-emitting device can be manufactured. Furthermore, when the present invention is used, a thin film can be formed on a large-area deposition target substrate; thus, a large light-emitting device and electronic device can be manufactured.

BRIEF DESCRIPTION OF THE DRAWINGS

In the accompanying drawings:

FIGS. 4A to 4F are cross-sectional views illustrating a manufacturing process of a light-emitting device of the present invention;

DETAILED DESCRIPTION OF THE INVENTION

Figure 1A:
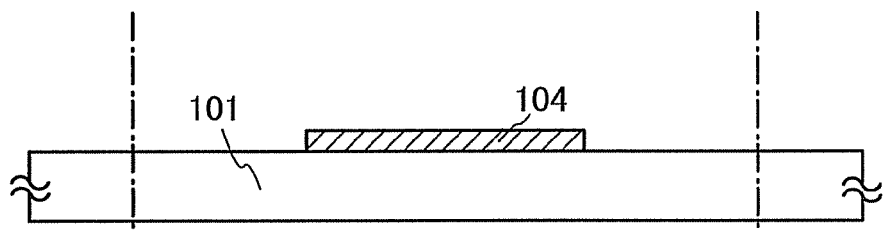
FIGS. 1A to 1F are cross-sectional views illustrating a deposition method of the present invention.

Embodiment Modes and Embodiment of the present invention will be hereinafter described with reference to the accompanying drawings. Note that it is easily understood by those skilled in the art that the present invention can be implemented in many different modes, and modes and details disclosed herein can be modified in a variety of ways without departing from the purpose and scope of the present invention. Therefore, the present invention should not be interpreted as being limited to the description below of Embodiment Modes and Embodiment. Note that reference numerals indicating the same portions are used in common in all drawings describing Embodiment Modes and Embodiment, and repeated description thereof is omitted.

Embodiment Mode 1

In this embodiment mode, an example of a deposition method for the purpose of forming a thin film in a minute pattern on a deposition target substrate by the present invention will be described with reference to FIGS. 1A to 1F and FIGS. 15A to 15H.

FIG. 1A illustrates an example of a deposition substrate. A light-absorbing layer 104 is selectively formed over a first substrate 101. An insulating film which serves as a base film may be formed between the first substrate 101 and the light-absorbing layer 104.

In the present invention, light is emitted to the light-absorbing layer 104 formed over the deposition substrate from the first substrate 101 side to deposit a film onto a deposition target substrate. Therefore, the first substrate 101 should have a light-transmitting property with respect to light to be used and the light-absorbing layer 104 should have a light-absorbing property with respect to light to be used. Thus, since kinds of materials suitable for the first substrate 101 and the light-absorbing layer 104 vary depending on the wavelength of irradiation light, the material should be selected as appropriate.

Further, the first substrate 101 is preferably formed using a material having low thermal conductivity. With the first substrate 101 having low thermal conductivity, heat obtained from irradiation light can be efficiently used for deposition. As the first substrate 101, for example, a glass substrate, a quartz substrate, a plastic substrate containing an inorganic material, or the like can be used. As a glass substrate, any of a variety of glass substrates used in the electronics industry, which are called a nonalkali glass substrate, such as an aluminosilicate glass substrate, an aluminoborosilicate glass substrate, or a barium borosilicate glass substrate; and the like can be used.

The light-absorbing layer 104 absorbs irradiation light which is used at the time of deposition. Therefore, it is preferable the light-absorbing layer 104 be formed of a material which has low reflectance and high absorptance with respect to irradiation light. Specifically, the light-absorbing layer 104 preferably has a reflectance of less than or equal to 70% with respect to irradiation light.

Any of a variety of kinds of materials can be used for the light-absorbing layer 104. For example, metal nitride such as titanium nitride, tantalum nitride, molybdenum nitride, or tungsten nitride; metal such as titanium, molybdenum, or tungsten; carbon; or the like can be used. Note that, since the kind of material which is suitable for the light-absorbing layer 104 varies depending on the wavelength of irradiation light, the material should be selected as appropriate. In addition, the light-absorbing layer 104 is not limited to a single layer and may include a plurality of layers. The light-absorbing layer 104 may have, for example, a stacked-layer structure of metal and metal nitride.

The light-absorbing layer 104 can be formed by any of a variety of kinds of methods. The light-absorbing layer 104 can be formed by, for example, a sputtering method, an electron beam evaporation method, a vacuum evaporation method, a chemical vapor deposition (CVD) method, or the like.

It is preferable that the light-absorbing layer 104 have such a thickness that the irradiation light cannot be transmitted although the thickness depends on a material. Specifically, the light-absorbing layer 104 preferably has a thickness of greater than or equal to 10 nm and less than or equal to 2 μm. Further, since the thinner the thickness of the light-absorbing layer 104 is, the smaller the energy of laser light used for deposition is needed, the light-absorbing layer 104 more preferably has a thickness of greater than or equal to 10 nm and less than or equal to 600 nm. For example, in the case of performing irradiation with light having a wavelength of 532 nm, with the thickness of the light-absorbing layer 104 of greater than or equal to 50 nm and less than or equal to 200 nm, the irradiation light can be efficiently absorbed to generate heat. In addition, with the thickness of the light-absorbing layer 104 of greater than or equal to 50 nm and less than or equal to 200 nm, deposition onto a deposition target substrate can be performed with high accuracy.

The light-absorbing layer 104 may partially transmit irradiation light as long as a material contained in a material layer 105 can be heated until the temperature at which the material can be deposited (the temperature at which at least part of the material contained in the material layer 105 is deposited onto the deposition target substrate). Note that when the light-absorbing layer 104 partially transmits the irradiation light, it is preferable that a material which is not decomposed by light be used as the material contained in the material layer 105.

The material layer 105 containing a material which is to be deposited onto the deposition target substrate is formed over the light-absorbing layer 104. In the present invention, particles containing an organic compound material are dispersed over and fixed onto the first substrate 101 and the light-absorbing layer 104, so that the material layer 105 is formed. In other words, the particles containing an organic compound material are melted by heat treatment to be fixed onto the first substrate 101 and the light-absorbing layer 104 as a film-like material layer. In this embodiment mode, particles 151 containing an organic compound material are dispersed over the first substrate 101 and the light-absorbing layer 104 (see FIG. 1B).

The particles containing an organic compound material do not always need to be melted to be a continuous film as long as they are fixed onto the light-absorbing layer by heat treatment. Further, when melted, the entire particles containing an organic compound material do not need to be completely melted, and the particles containing an organic compound material may be melted so that a portion where the light-absorbing layer and the particles containing an organic compound material are in contact with each other may be partially melted, just so as to be fixed onto the light-absorbing layer.

In this embodiment mode, a mask 152 is used when the particles 151 containing an organic compound material are dispersed. The mask 152 is a mask for covering an edge of the first substrate 101. The edge of the first substrate 101 is not used as a deposition target region of the material layer. The particles are not dispersed over the edge of the first substrate 101 due to the mask 152, and accordingly the material layer is not formed over the edge of the first substrate 101 and a material can be prevented from being attached to a container of a transfer unit, a batch, or the like. Further, although an alignment marker is formed at the edge of the first substrate at the time of formation of the light-absorbing layer, a defect in that the marker is covered by the particles or the material layer can also be prevented.

Moreover, the particles 151 which are blocked by the mask 152 can be easily collected and can be reused for deposition. Thus, material use efficiency can be significantly increased.

A step of dispersing the particles containing an organic compound material by using a mask for covering an edge of a substrate will be described with reference to FIGS. 15A to 15H.

FIGS. 15A to 15D are cross-sectional views of a deposition substrate taken along the lines T-U in FIGS. 15E to 15H, respectively. FIGS. 15E to 15H are plan views of the deposition substrate.

The deposition substrate illustrated in FIGS. 15A to 15H is an example of manufacturing a plurality of panels for display devices from one substrate. Therefore, a plurality of light-absorbing layer formation regions 202 are formed over a first substrate 201 (see FIGS. 15A and 15E). Although not illustrated, a plurality of light-absorbing layers are selectively provided in the plurality of light-absorbing layer formation regions 202 in accordance with a pattern of a film which is to be deposited onto a deposition target substrate.

Figure 15A:
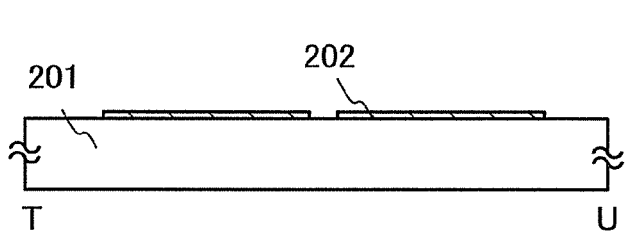
FIGS. 15A to 15H are cross-sectional views illustrating a manufacturing process of a light-emitting device of the present invention.
Figure 15E:
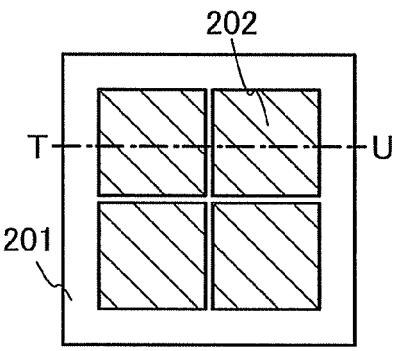
Figure 15B:
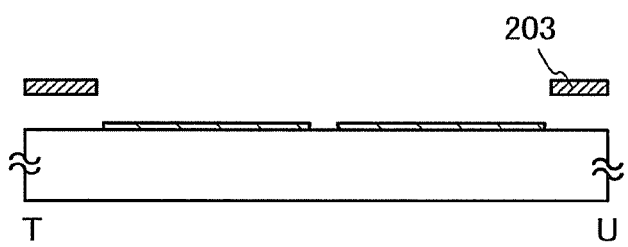
Figure 15F:
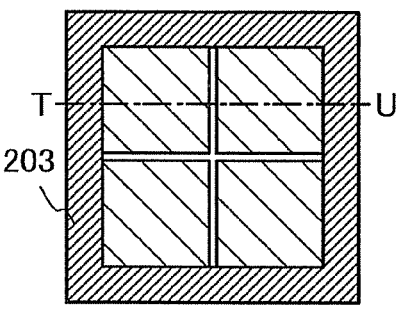

Next, a mask 203 which covers an edge of the first substrate 201 is placed (see FIGS. 15B and 15F). The position of the mask 203 with respect to the first substrate 201 may be aligned with use of a marker which can be formed over the first substrate 201 in the same step as formation of a light-absorbing layer.

Figure 15C:
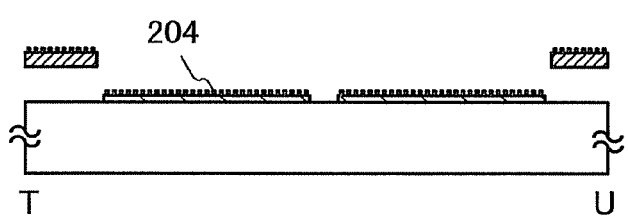
Figure 15G:
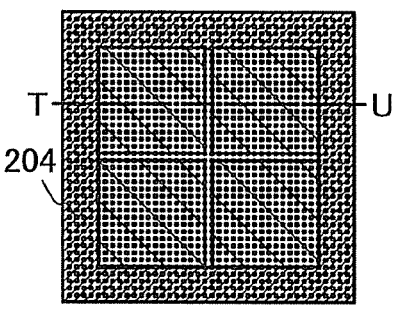
Figure 15D:
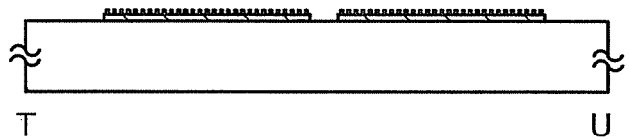
Figure 15H:
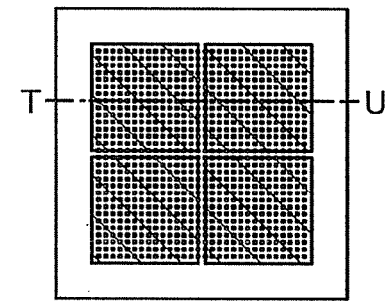

Next, particles 204 containing an organic compound material are dispersed over the first substrate 201 and the light-absorbing layer formation regions 202 with use of the mask 203 (see FIGS. 15C and 15G). The particles 204 containing an organic compound material, which are dispersed over the mask 203 by being blocked by the mask 203 at this time, can be easily collected, and thus the particles 204 containing an organic compound material can be reused. When the mask 203 is removed, the following state is obtained: the particles 204 containing an organic compound material have not been dispersed over the edge of the first substrate 201 due to the mask 203 whereas the particles 204 containing an organic compound material have been dispersed over the light-absorbing layer formation regions 202 (see FIGS. 15D and 15H). Thus, a material layer is not formed at the edge of the first substrate 201 even if heat treatment, which is a subsequent step, is performed and contamination of a device due to formation of the material layer can be prevented.

Further, the step of dispersing the particles 204 containing an organic compound material may be performed under reduced pressure.

In the present invention, any of a variety of methods can be used as long as the method is capable of dispersing (diffusing) the particles containing an organic compound material.

As a method of dispersing the particles containing an organic compound material, which can be used in the present invention, for example, there are an electro spray deposition (ESD) method, liquid source misted chemical deposition (LSMCD), and the like. The ESD method is a method in which with a high voltage applied between a nozzle and an electrode facing the nozzle, spray liquid is sprayed from the nozzle to be charged, and the spray liquid is attached to a substrate placed between the nozzle and the electrode. The spray liquid sprayed from the nozzle is dried instantly and can be deposited onto the substrate in a particulate state.

In the present invention, for example, in the case of using a spray method as a dispersion method, when the particles containing an organic compound material are dispersed, a solvent which disperses the particles may be used. However, the solvent is preferably removed by drying or heating before or immediately after the particles containing an organic compound material are attached onto the deposition substrate. There is no particular limitation on the solvent as long as it can disperse the material and it does not react with the material. For example, as the solvent, any of the following can be used: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, and xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like. A mixture of plural kinds of these solvents may also be used.

Figure 1B:
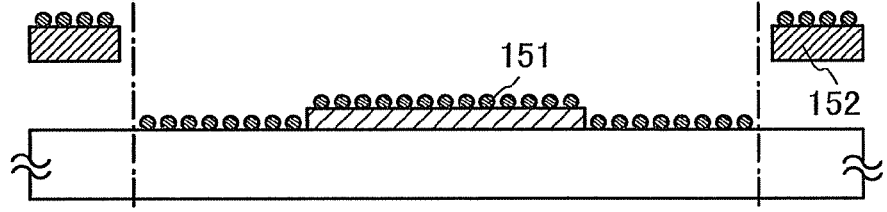
Figure 1C:
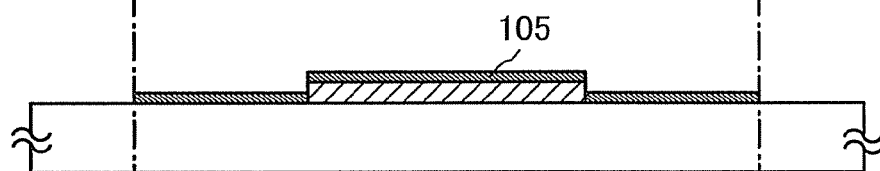

The particles 151 containing an organic compound material are fixed by heat treatment to form the material layer 105 over the first substrate 101 and the light-absorbing layer 104 (see FIG. 1C). In the present invention, the particles 151 containing an organic compound material, which are deposited over (attached to) the first substrate 101 and the light-absorbing layer 104, are fixed over the entire area by the heat treatment, so that the material layer 105 is formed.

The step of heating the particles 151 containing an organic compound material is preferably performed in a nitrogen or rare gas atmosphere. The nitrogen or rare gas atmosphere can prevent impurities in the air, such as water, from being mixed into the material layer 105. In addition, when nitrogen or a rare gas is made to flow, impurities or extra particles containing an organic compound material can be removed and collected.

The heat treatment can be performed with a heating furnace under normal pressure or reduced pressure. Further, a rapid thermal anneal (RTA) method such as a gas rapid thermal anneal (GRTA) method and a lamp rapid thermal anneal (LRTA) method may be used. A GRTA method is a method in which heat treatment is performed by a high-temperature gas whereas an LRTA method is a method in which heat treatment is performed by light emitted from a lamp. Note that the timing of performing the heat treatment and the number of the heat treatment are not particularly limited. The conditions such as temperature and time for favorably performing the heat treatment depend on the characteristics of a material of the substrate and the particles containing an organic compound material.

The material use efficiency of the method of dispersing and fixing the particles containing an organic compound material of the present invention is higher than that of an evaporation method, a sputtering method, or the like because the material is not dispersed in a chamber. Further, since the method can be performed under atmospheric pressure, facilities such as a vacuum apparatus can be reduced. Moreover, since the size of a substrate to be processed is not limited by the size of a vacuum chamber, it is possible to respond to use of a larger substrate to increase an area to be processed, whereby low cost and increase in productivity can be achieved. Since heat treatment the temperature of which is low enough to fix the particles containing an organic compound material is needed, even a substrate or a material which is decomposed or transformed by high heat treatment can be used.

As a material contained in the material layer 105, any of a variety of organic compound materials can be used as long as they can be deposited by dispersion and fixing onto at least the light-absorbing layer 104. In the case of forming an EL layer of a light-emitting element, a material for forming an EL layer, which can be deposited, is used. For example, an organic compound such as a light-emitting material or a carrier transporting material for forming an EL layer can be used.

The material layer 105 may contain a plurality of materials. Further, the material layer 105 may be a single layer or a stack of a plurality of layers.

Note that in the case where the thickness and uniformity of a film which is to be formed on the deposition target substrate are controlled with the material layer 105, the thickness and uniformity of the material layer 105 should be controlled. However, the material layer 105 does not always need to be a uniform layer if the thickness and uniformity of a film which is to be formed on the deposition target substrate is not affected. For example, the material layer 105 may be formed into a minute island or may have unevenness.

The material layer 105 contains a material which is to be deposited onto the deposition target substrate. When the deposition substrate is irradiated with light, the material contained in the material layer 105 is heated and at least a part of the material contained in the material layer 105 is deposited onto the deposition target substrate. Specifically, by heating the material layer 105, at least a part of the material contained in the material layer 105 is evaporated, or at least a part of the material layer 105 is peeled off by stress variation due to thermal deformation. Accordingly, a film is deposited onto the deposition target substrate.

Figure 1D:
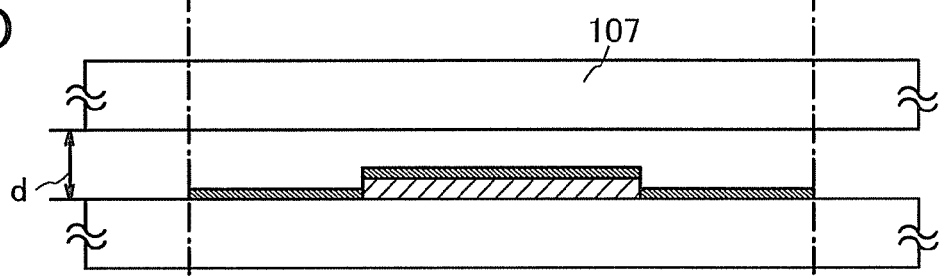

Next, a second substrate 107 which is a deposition target substrate is placed at a position facing a surface which is one of surfaces of the first substrate 101 and over which the light-absorbing layer 104 and the material layer 105 are formed (see FIG. 1D). The second substrate 107 is a deposition target substrate onto which a desired layer is to be deposited by a deposition process. The first substrate 101 and the second substrate 107 are made to face each other in proximity: specifically, they are brought close to face each other so that the distance d between the surface of the first substrate 101 and the surface of the second substrate 107 is greater than or equal to 0 mm and less than or equal to 2 mm, preferably greater than or equal to 0 mm and less than or equal to 0.05 mm, more preferably greater than or equal to 0 mm and less than or equal to 0.03 mm. If the first substrate 101 and the second substrate 107 are particularly large, an error occurs to the distance d between the substrates due to bend or warpage of the substrates, and the value of the distance d has distribution in some cases. In this case, the distance d is the shortest distance between the first substrate 101 and the second substrate 107. In some cases, the first substrate 101 and the second substrate 107 are partially in contact with each other depending on the size or arrangement method of the substrates.

In the case where higher reliability is desired to be given to a film which is to be deposited, heat treatment is preferably performed on the deposition substrate in which the light-absorbing layer 104 and the material layer 105 are formed over the first substrate 101 in vacuum. Similarly, when heat treatment is also performed on the second substrate 107 which is the deposition target substrate in vacuum before deposition, the reliability of a film to be deposited is increased. In particular, in the case of providing an insulating layer which serves as a partition wall for the deposition target substrate, when impurities such as water are removed by heat treatment in vacuum, a film with higher reliability can be deposited, and the reliability of a light-emitting element and a light-emitting device which are to be manufactured can also be increased.

Figure 1E:
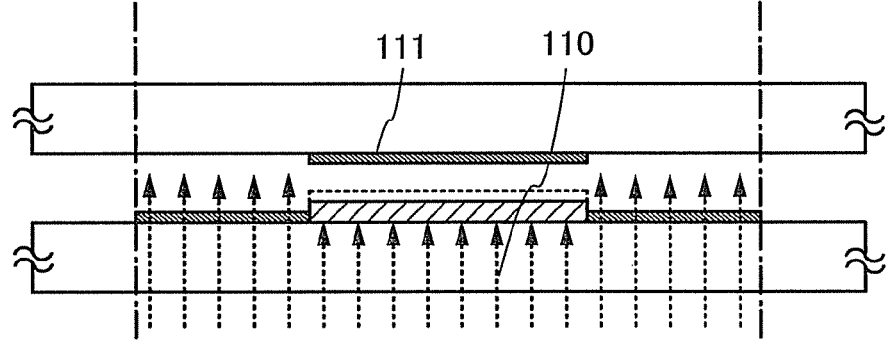
Figure 1F:
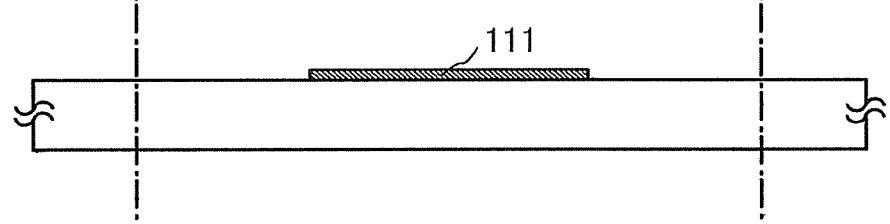

Next, irradiation with light 110 is performed from a rear surface (a surface on which the light-absorbing layer 104 and the material layer 105 are not formed) side of the first substrate 101 (see FIG. 1E). At this time, the light emitted to the first substrate 101 is transmitted through the first substrate 101 to be absorbed by the light-absorbing layer 104. Then, the light-absorbing layer 104 gives the heat obtained from the absorbed light to the material contained in the material layer 105, so that at least a part of the material contained in the material layer 105 is deposited as a film 111 onto the second substrate 107. Accordingly, the film 111 which is shaped into a desired pattern is formed on the second substrate 107 (see FIG. 1F).

The step of irradiating the light-absorbing layer 104 with the light 110 is preferably performed under reduced pressure. When the irradiation with the light 110 is performed to deposit the material onto the deposition target substrate under reduced pressure, an effect of contaminants such as dust on a film to be deposited can be reduced. Alternatively, the step of irradiating the light-absorbing layer 104 with the light 110 may be performed in a heating state (a state in which the material layer 105 has heat). If heat treatment is performed on the material layer 105 to make the material layer 105 in a heating state, the material contained in the material layer 105 can be deposited onto the deposition target substrate even by light irradiation using a light source of light with low power. Further, if the material layer 105 is in a heating state, a margin of a light irradiation condition can be enlarged. When the irradiation with the light 110 is performed immediately after the heat treatment which is performed at the time of forming the material layer 105, the material layer 105 can be in a heating state. Alternatively, the irradiation with the light 110 may be performed while the material layer 105 is heated with use of a heating means such as a heater.

Laser light can be used as the irradiation light 110. Further, the wavelength of the laser light is not particularly limited and laser light having a variety of wavelengths can be used. For example, laser light having a wavelength of 355 nm, 515 nm, 532 nm, 1030 nm, 1064 nm, or the like can be used.

As the laser light, it is possible to use light oscillated from one or more of a gas laser such as an Ar laser, a Kr laser, or an excimer laser; or a solid-state laser such as a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic, a third harmonic, or higher harmonics oscillated from the above-described solid-state laser can be used. Note that, when a solid-state laser whose laser medium is solid is used, there are advantages that a maintenance-free condition can be maintained for a long time and output is relatively stable.

The shape of a laser spot is preferably linear or rectangular. With a linear or rectangular laser spot, a substrate to be processed can be efficiently scanned with laser light. Thus, time taken for deposition (takt time) is shortened, which leads to increase in productivity. Further, the shape of a laser spot may be oval.

In the present invention, the material layer 105 is not heated with radiation heat from the irradiation light from a light source but the irradiation light from a light source is absorbed by the light-absorbing layer 104, and the light-absorbing layer 104 gives the heat to the material layer 105. Thus, it is preferable to set light irradiation time to be short so that an area of the material layer 105 which is heated is not enlarged due to conduction of heat in a plane direction from a part of the light-absorbing layer 104 which is irradiated with the light to a part of the light-absorbing layer 104 which is not irradiated with light.

It is preferable that deposition by light irradiation be performed in a reduced-pressure atmosphere. Accordingly, it is preferable that the deposition chamber have a pressure of less than or equal to $5\times10^{-3}$ Pa, more preferably greater than or equal to $10^{-6}$ Pa and less than or equal to $10^{-4}$ Pa.

Furthermore, as the irradiation light 110, laser light of which repetition rate is greater than or equal to 10 MHz and pulse width is greater than or equal to 100 fs and less than or equal to 10 ns is preferable. With use of such laser light whose pulse width is very small, thermal conversion in the light-absorbing layer 104 is efficiently performed, and thus the material can be efficiently heated.

Since the laser light of which repetition rate is greater than or equal to 10 MHz and pulse width is greater than or equal to 100 fs and less than or equal to 10 ns is capable of short-time irradiation, diffusion of heat can be suppressed and a minute pattern can be deposited. In addition, since the laser light of which repetition rate is greater than or equal to 10 MHz and pulse width is greater than or equal to 100 fs and less than or equal to 10 ns is capable of high output, a large area can be processed at a time, and thus time taken for deposition can be shortened. Accordingly, productivity can be increased.

When the distance d which is defined as the shortest distance between the surface of the first substrate 101 and the surface of the second substrate 107 is reduced, a layer at the outermost surface of the first substrate 101 and the outermost surface of the second substrate 107 are in contact with each other in some cases. By reduction of the distance d, the shape of the film 111 which is deposited onto the second substrate 107 can be formed with high accuracy at the time of light irradiation.

In the present invention, the particles containing an organic compound material are dispersed and fixed to form the material layer over the deposition substrate, and light irradiation is performed from the lower side of the deposition substrate to deposit the material contained in the material layer onto the deposition target substrate which is placed above. Thus, the deposition substrate can be placed with the material layer side facing upwards (also referred to as so-called "face-up placement") throughout the deposition process. Since the deposition substrate does not need to be placed with the material layer side facing downwards (also referred to as so-called "face-down placement") during the process, contamination of the material layer due to dust or the like during the process can be reduced.

In the case of manufacturing a full-color display, light-emitting layers of three colors should be separately formed, and use of a deposition method of the present invention makes it possible to separately form the light-emitting layers easily. In addition, the light-emitting layers can be separately formed with high accuracy.

When the present invention is applied, by control of the thickness of the material layer formed over the first substrate, the thickness of a film which is to be deposited onto the second substrate which is a deposition target substrate can be controlled. In other words, the thickness of the material layer formed over the first substrate is controlled in advance so that a film which is to be formed on the second substrate can have a desired thickness by deposition of all materials contained in the material layer formed over the first substrate; thus, a thickness monitor is not needed at the time of deposition onto the second substrate. Therefore, a user does not need to adjust the deposition rate with a thickness monitor, and the deposition process can be fully automated. Accordingly, productivity can be increased.

Further, by application of the present invention, the material contained in the material layer 105 formed over the first substrate 101 can be uniformly deposited. Moreover, even in the case where the material layer 105 contains a plurality of materials, a film containing the same materials at substantially the same weight ratios as those of the material layer 105 can be deposited onto the second substrate 107 which is a deposition target substrate. Therefore, as for a deposition method according to the present invention, even in the case where deposition is performed using a plurality of materials having different deposition temperatures, unlike co-evaporation, the evaporation rate of each material does not need to be controlled. Thus, without complicated control of the evaporation rate or the like, a layer containing desired different materials can be deposited easily with high accuracy.

Further, by the deposition method of the present invention, a desired material can be deposited onto the deposition target substrate without being wasted. Thus, material use efficiency is increased, which can lead to reduction in manufacturing cost. Moreover, a material can be prevented from being attached to an inner wall of a deposition chamber, and thus maintenance of a deposition apparatus can be facilitated.

Further, since deposition is performed using the material layer which has been once thinned in the present invention, a film which is flat and has little unevenness can be formed onto the deposition target substrate. In addition, deposition only onto a desired region is possible, and thus a minute pattern can be formed, which can lead to manufacture of a high-definition light-emitting device.

Further, since the application of the present invention enables selective deposition onto a desired region at the time of deposition using light, material use efficiency can be increased and a film can be easily deposited in a desired shape with high accuracy; thus, productivity can be increased.

Embodiment Mode 2

In this embodiment mode, another example of a deposition method for the purpose of forming a thin film in a minute pattern onto a deposition target substrate by the present invention will be described with reference to FIGS. 15A to 15H, FIGS. 18A to 18G, and FIGS. 21A and 21B. In this embodiment mode, an example will be described in which a material layer is selectively formed over a light-absorbing layer in Embodiment Mode 1. Therefore, the same portions as or portions having similar functions to Embodiment Mode 1 are denoted by the same reference numerals, Embodiment Mode 1 can be referred to, and the repeated descriptions thereof are omitted.

Figure 18A:
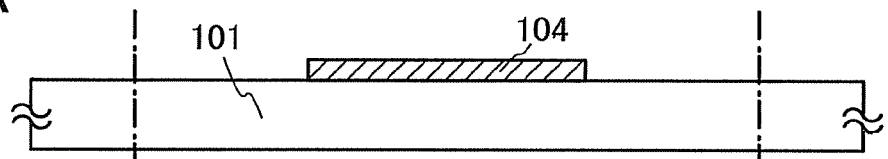
FIGS. 18A to 18G are cross-sectional views illustrating a deposition method of the present invention.

FIG. 18A illustrates an example of a deposition substrate. The light-absorbing layer 104 is selectively formed over the first substrate 101.

In the present invention, light is emitted to the light-absorbing layer 104 formed over the deposition substrate from the first substrate 101 side to deposit a film onto a deposition target substrate.

The material layer 105 containing a material which is to be deposited onto a deposition target substrate is formed over the light-absorbing layer 104. In the present invention, particles containing an organic compound material are dispersed and selectively fixed onto the light-absorbing layer 104, so that the material layer 105 is formed. The particles containing an organic compound material are melted by heat treatment to be fixed onto the light-absorbing layer 104 as a film-like material layer. In this embodiment mode, the particles 151 containing an organic compound material are dispersed over the first substrate 101 and the light-absorbing layer 104 (see FIG. 18B).

Figure 18B:
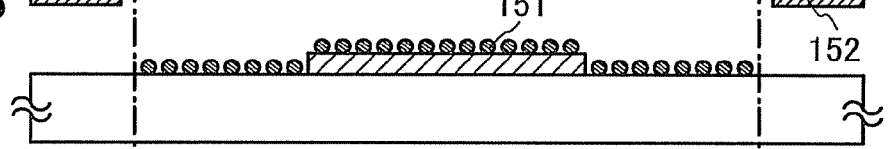

In this embodiment mode, the mask 152 is used when the particles 151 containing an organic compound material are dispersed. The mask 152 is a mask for covering at least an edge of the first substrate 101. In FIG. 18B, the edge of the first substrate 101 is not used as a deposition target region of the material layer. The particles are not dispersed over the edge of the first substrate 101 due to the mask 152, and accordingly the material layer is not formed over the edge of the first substrate 101 and a material can be prevented from being attached to a container of a transfer unit, a batch, or the like. Further, although an alignment marker is formed at the edge of the first substrate at the time of formation of the light-absorbing layer, a defect in that the marker is covered by the particles or the material layer can also be prevented.

Moreover, the particles 151 which are blocked by the mask 152 can be easily collected and can be reused for deposition. Thus, material use efficiency can be significantly increased.

Figure 18C:
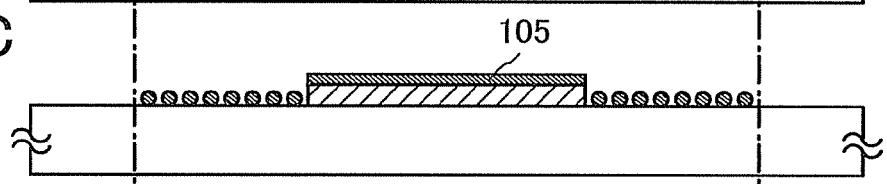

The particles 151 containing an organic compound material over the light-absorbing layer 104 are fixed by selective heat treatment, so that the material layer 105 is formed over the light-absorbing layer 104 (see FIG. 18C). In this embodiment mode, of the particles 151 containing an organic compound material, which have been deposited over (attached to) the first substrate 101 and the light-absorbing layer 104, only the particles 151 which are over the light-absorbing layer 104 are fixed by the heat treatment, so that the material layer 105 is formed over the light-absorbing layer 104. Thus, of the particles 151 containing an organic compound material which have been dispersed over the first substrate 101 and the light-absorbing layer 104, the particles over the first substrate 101 remain particulate and are not fixed.

For the heat treatment, a method of selectively heating the particles containing an organic compound material over the light-absorbing layer is used. A light irradiation step using light absorbed by the light-absorbing layer under normal pressure or reduced pressure is preferably used.

There is no particular limitation on light to be used. Any one of infrared light, visible light, and ultraviolet light, or a combination thereof can be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. In that case, a lamp light source may be activated for a necessary period of time for irradiation, or irradiation may be performed plural times.

Further, laser light may also be used as the light. As a laser device, a laser device capable of emitting ultraviolet light, visible light, or infrared light can be used. An excimer laser device using KrF, ArF, XeCl, Xe, or the like; a gas laser device using He, He—Cd, Ar, He—Ne, HF, or the like; a solid-state laser device using a crystal such as YAG, $GdVO_4$, $YVO_4$, YLF, or $YAlO_3$ doped with Cr, Nd, Er, Ho, Ce, Co, Ti, or Tm; or a semiconductor laser device using GaN, GaAs, GaAlAs, InGaAsP, or the like can be used as the laser device. As for the solid-state laser device, it is preferable to use first to fifth harmonics of fundamental waves.

Further, a heating furnace, or a rapid thermal anneal (RTA) method such as a gas rapid thermal anneal (GRTA) method or a lamp rapid thermal anneal (LRTA) method may be used as long as it is capable of selectively heating the particles containing an organic compound material over the light-absorbing layer. Note that the timing of performing the heat treatment and the number of the heat treatment are not particularly limited. The conditions such as temperature and time for favorably performing the heat treatment depend on the characteristics of a material of the substrate and the particles containing an organic compound material.

The material use efficiency of the method of dispersing and fixing the particles containing an organic compound of the present invention is higher than that of an evaporation method, a sputtering method, or the like because the material is not dispersed in a chamber. Further, since the method can be performed under atmospheric pressure, facilities such as a vacuum apparatus can be reduced. Moreover, since the size of a substrate to be processed is not limited by the size of a vacuum chamber, it is possible to respond to use of a larger substrate to increase an area to be processed, whereby low cost and increase in productivity can be achieved. Since heat treatment the temperature of which is low enough to fix the particles containing an organic compound material is needed, even a substrate or material which is decomposed or transformed by high heat treatment can be used.

Figure 18D:
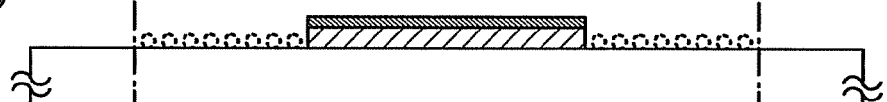

Next, of the particles 151 containing an organic compound material which have been dispersed over the first substrate 101 and the light-absorbing layer 104, the particles 151 over the first substrate 101 are removed (see FIG. 18D). The step of removing the particles 151 containing an organic compound is described with reference to FIGS. 21A and 21B.

Figure 21A:
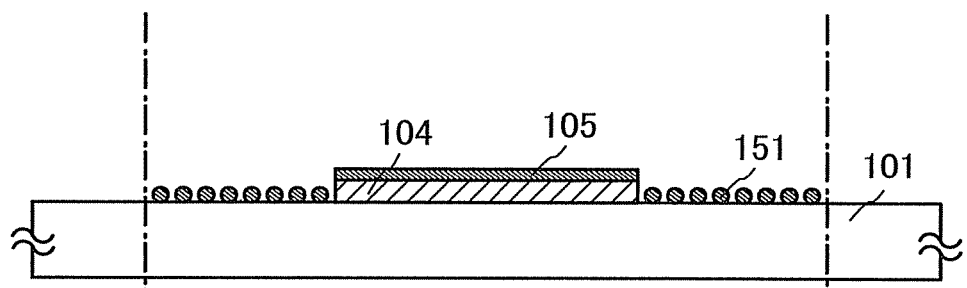
FIGS. 21A and 21B are cross-sectional views illustrating a manufacturing process of a light-emitting device of the present invention.

The step illustrated in FIG. 21A corresponds to that illustrated in FIG. 18C. The light-absorbing layer 104 is selectively provided over the first substrate 101, and the particles 151 containing an organic compound material over the light-absorbing layer 104 are fixed to form the material layer 105. Of the particles 151 containing an organic compound material which have been dispersed over the first substrate 101 and the light-absorbing layer 104, the particles 151 over the first substrate 101 are dispersed in a state in which the particles 151 containing an organic compound material are not fixed onto the first substrate 101.

Figure 21B:
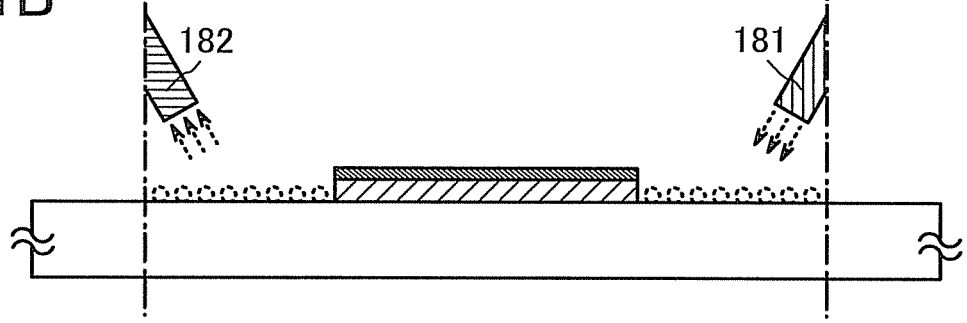

Of the particles 151 containing an organic compound material which have been dispersed over the first substrate 101 and the light-absorbing layer 104, the particles 151 over the first substrate 101 are removed with use of an inert gas such as nitrogen sprayed from a nozzle 181 in the direction of arrows and are collected by a nozzle 182 which sucks in air in the direction of arrows (see FIG. 21B). The collected particles 151 containing an organic compound material can be reused in a deposition process. The particles 151 containing an organic compound material may be removed physically using a brush in such a manner that the first substrate 101 is inclined so that the particles 151 containing an organic compound material falls off the first substrate 101 as well as a manner that an inert gas such as nitrogen is sprayed as in this embodiment mode. The particles 151 containing an organic compound material which are not used as the material layer 105 as described above are collected and reused, so that waste of material can be reduced and material use efficiency can be increased; thus, reduction in cost is possible.

Through the above-described steps, a deposition substrate having the light-absorbing layer 104 and the material layer 105 which are selectively stacked over the first substrate 101 in the same pattern can be formed.

The material layer 105 contains a material which is to be deposited onto a deposition target substrate. When the deposition substrate is irradiated with light, the material contained in the material layer 105 is heated and at least a part of the material contained in the material layer 105 is deposited onto the deposition target substrate. When the material layer 105 is heated, at least a part of the material contained in the material layer 105 is evaporated, or at least a part of the material layer 105 is deformed due to heat, and accordingly a film comes off due to change in stress to be deposited onto the deposition target substrate.

Figure 18E:
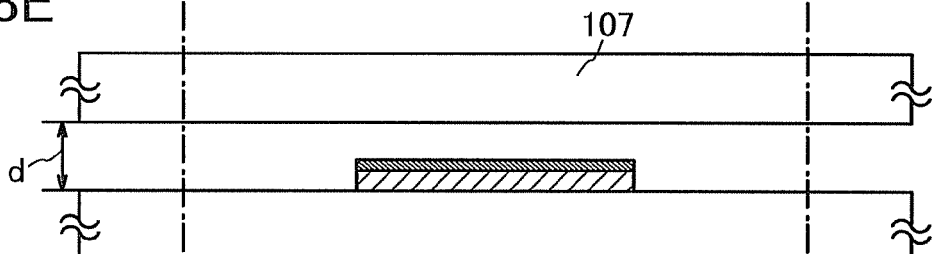

Next, the second substrate 107 which is a deposition target substrate is placed at a position facing a surface which is one of surfaces of the first substrate 101 and over which the light-absorbing layer 104 and the material layer 105 are formed (see FIG. 18E).

Figure 18F:
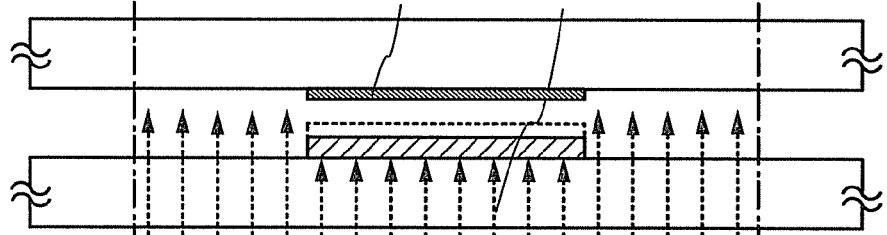
Figure 18G:
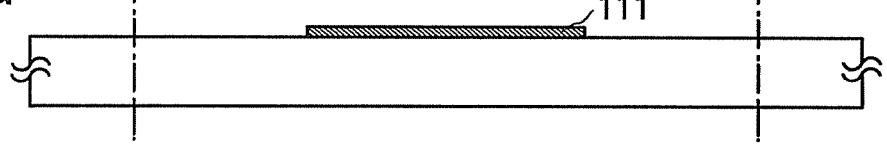

Next, irradiation with the light 110 is performed from the rear surface (the surface on which the light-absorbing layer 104 and the material layer 105 are not formed) side of the first substrate 101 (see FIG. 18F). At this time, the light emitted to the first substrate 101 is transmitted through the first substrate 101 to be absorbed by the light-absorbing layer 104. Then, the light-absorbing layer 104 gives the heat obtained from the absorbed light to the material contained in the material layer 105, so that at least a part of the material contained in the material layer 105 is deposited as a film 111 onto the second substrate 107. Accordingly, the film 111 which is shaped into a desired pattern is formed on the second substrate 107 (see FIG. 18G).

In the present invention, the particles containing an organic compound material are dispersed and fixed to form the material layer over the deposition substrate, and light irradiation is performed from the lower side of the deposition substrate to deposit the material contained in the material layer onto the deposition target substrate which is placed above. Thus, the deposition substrate can be placed with the material layer side facing upwards (also referred to as so-called "face-up placement") throughout the deposition process. Since the deposition substrate does not need to be placed with the material layer side facing downwards (also referred to as so-called "face-down placement") during the process, contamination of the material layer due to dust or the like during the process can be reduced.

In the case of manufacturing a full-color display, light-emitting layers of three colors should be separately formed, and use of a deposition method of the present invention makes it possible to separately form the light-emitting layers easily. In addition, the light-emitting layers can be separately formed with high accuracy.

When the present invention is applied, by control of the thickness of the material layer formed over the light-absorbing layer, the thickness of a film which is to be deposited onto the second substrate which is a deposition target substrate can be controlled. In other words, the thickness of the material layer formed over the light-absorbing layer is controlled in advance so that a film which is to be formed on the second substrate can have a desired thickness by deposition of all materials contained in the material layer formed over the light-absorbing layer; thus, a thickness monitor is not needed at the time of deposition onto the second substrate. Therefore, a user does not need to adjust the deposition rate with a thickness monitor, and the deposition process can be fully automated. Accordingly, productivity can be increased.

Further, by application of the present invention, the material contained in the material layer 105 formed over the light-absorbing layer 104 can be uniformly deposited. Moreover, even in the case where the material layer 105 contains a plurality of materials, a film containing the same materials at substantially the same weight ratios as those of the material layer 105 can be deposited onto the second substrate 107 which is a deposition target substrate. Therefore, as for the deposition method according to the present invention, even in the case where deposition is performed using a plurality of materials having different deposition temperatures, unlike co-evaporation, the evaporation rate of each material does not need to be controlled. Thus, without complicated control of the evaporation rate or the like, a layer containing desired different materials can be deposited easily with high accuracy.

Further, by a deposition method of the present invention, a desired material can be deposited onto the deposition target substrate without being wasted. Thus, material use efficiency is increased, which can lead to reduction in manufacturing cost. Moreover, a material can be prevented from being attached to an inner wall of a deposition chamber, and thus maintenance of a deposition apparatus can be facilitated.

Further, since deposition is performed using the material layer which has been once thinned in the present invention, a film which is flat and has little unevenness can be formed. In addition, deposition only onto a desired region is possible, and thus a minute pattern can be formed, which can lead to manufacture of a high-definition light-emitting device.

Further, since the application of the present invention enables selective deposition onto a desired region at the time of deposition using light, material use efficiency can be increased and a film can be easily deposited in a desired shape with high accuracy; thus, productivity can be increased.

Embodiment Mode 3

In this embodiment mode, a method for manufacturing a light-emitting device which is capable of full-color display by forming an EL layer of a light-emitting element with use of a plurality of deposition substrates which are described in Embodiment Mode 1 or 2 will be described.

In the present invention, EL layers which are all formed using the same material can be formed on a plurality of electrodes formed on a second substrate which is a deposition target substrate through one deposition process. In addition, in the present invention, EL layers of three different emission colors can be formed on their respective electrodes formed on the second substrate.

First, as described in Embodiment Mode 1, for example, three deposition substrates corresponding to the deposition substrate illustrated in FIG. 1A are prepared. Material layers for forming EL layers of different emission colors are provided for the three respective deposition substrates. Specifically, a first deposition substrate having a material layer (R) containing a material for forming an EL layer which emits red light (an EL layer (R)), a second deposition substrate having a material layer (G) containing a material for forming an EL layer which emits green light (an EL layer (G)), and a third deposition substrate having a material layer (B) containing a material for forming an EL layer which emits blue light (an EL layer (B)) are prepared.

In addition, one deposition target substrate having a plurality of first electrodes is prepared. Note that since edges of the plurality of first electrodes are covered with an insulator, a light-emitting region corresponds to a part of the first electrode, which is exposed without overlapping with the insulator.

First, for a first deposition process, the deposition target substrate and the first deposition substrate are superimposed on each other and aligned with each other in a similar manner to FIG. 1D. Note that it is preferable that the deposition target substrate be provided with an alignment marker. In addition, it is preferable that the first deposition substrate be also provided with an alignment marker. As in Embodiment Modes 1 and 2, the material layer (R) is not provided near the alignment marker of the first deposition substrate in advance.

Then, irradiation with light is performed from the rear surface (the surface on which the light-absorbing layer 104 and the material layer 105 are not formed, which is illustrated in FIGS. 1A to -1F,) side of the first deposition substrate. The light-absorbing layer absorbs the irradiation light and gives the heat to the material layer (R) to heat the material contained in the material layer (R). Thus, an EL layer (R) is formed on some of the first electrodes on the deposition target substrate. After the first deposition is completed, the first deposition substrate is moved away from the deposition target substrate.

Next, for a second deposition process, the deposition target substrate and the second deposition substrate are superimposed on each other and aligned with each other. The second deposition substrate is provided with light-absorbing layers each at a position which is shifted by one pixel from that of the light-absorbing layer of the first deposition substrate used in the first deposition process.

Then, irradiation with light is performed from the rear surface (the surface over which the heat-insulating layer 104 and the material layer 105 are not formed, which is illustrated in FIGS. 1A to 1F,) side of the second deposition substrate. The light-absorbing layer absorbs the irradiation light and gives the heat to the material layer (G) to heat the material contained in the material layer (G). Thus, an EL layer (G) is formed on some of the first electrodes on the deposition target substrate, which are next to the first electrodes on which the EL layer (R) is formed in the first deposition process. After the second deposition is completed, the second deposition substrate is moved away from the deposition target substrate.

Next, for a third deposition process, the deposition target substrate and the third deposition substrate are superimposed on each other and aligned with each other. The third deposition substrate is provided with light-absorbing layers each at a position which is shifted by two pixels from that of the light-absorbing layer of the first deposition substrate used in the first deposition process.

Figure 7A:
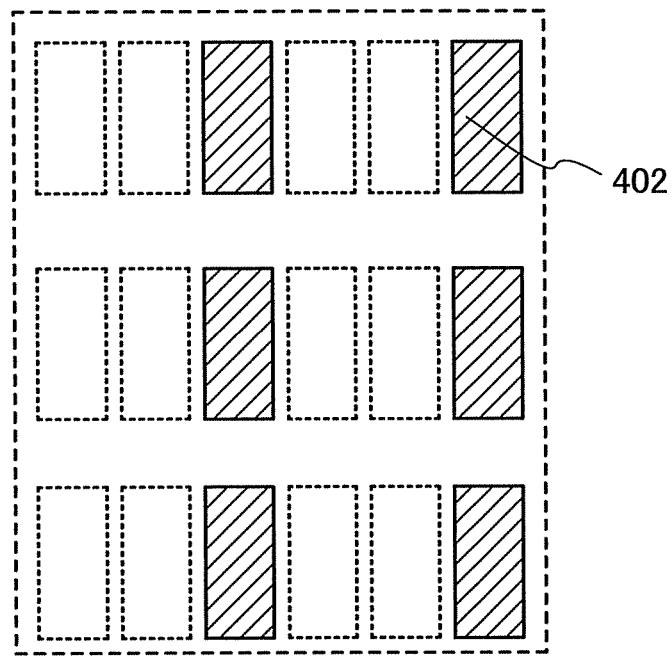
FIGS. 7A and 7B are plan views illustrating a manufacturing process of a light-emitting device of the present invention.

Then, irradiation with light is performed from the rear surface (a surface on which the light-absorbing layer 104 and the material layer 105 are not formed, which is illustrated in FIGS. 1A to 1F,) side of the third deposition substrate. A state right before the third deposition is performed corresponds to the plan view of FIG. 7A. In FIG. 7A, a light-absorbing layer 402 is selectively formed. Accordingly, light which is transmitted through the third deposition substrate is absorbed by the light-absorbing layer 402. In addition, first electrodes are formed in regions of the deposition target substrate, which overlap with the light-absorbing layers 402 of the third deposition substrate. Note that the EL layers (R) 411 which have been formed through the first deposition and the EL layers (G) 412 which have been formed through the second deposition are located under regions indicated by dotted lines in FIG. 7A.

Then, the EL layers (B) 413 are formed through the third deposition. The light-absorbing layer absorbs the irradiation light and gives the heat to the material layers (B) to heat the material contained in the material layers (B). Thus, the EL layers (B) 413 are formed on some of the first electrodes on the deposition target substrate, which are next to the first electrodes on which the EL layers (G) 412 are formed in the second deposition process. After the third deposition is completed, the second deposition substrate is moved away from the deposition target substrate.

In this manner, the EL layer (R) 411, the EL layer (G) 412, and the EL layer (B) 413 can be formed at regular intervals on one deposition target substrate. Then, second electrodes are formed on these layers, and thus light-emitting elements can be formed.

Through the above-described steps, the light-emitting elements which emit different colors are formed over one substrate, whereby a light-emitting device which is capable of full-color display can be manufactured.

Figure 7B:
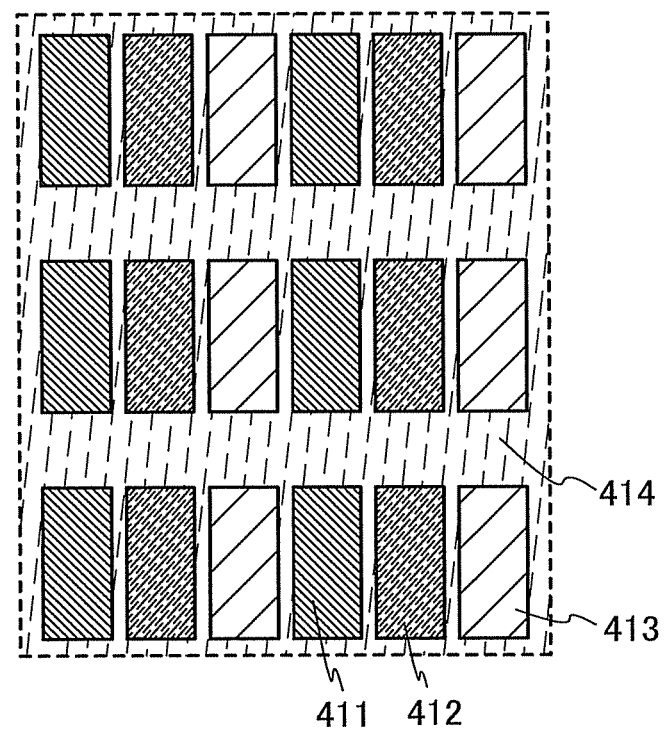

FIGS. 7A and 7B illustrate the example in which the light-absorbing layer 402 formed over the deposition substrate each have a rectangular shape. However, the present invention is not particularly limited to this example and stripe openings may be employed. In the case where the stripe openings are employed, although deposition is also performed between light-emitting regions for emitting light of the same color, a film is formed over the insulator 414, and thus a portion overlapping with the insulator 414 does not serve as a light-emitting region.

Figure 8A:
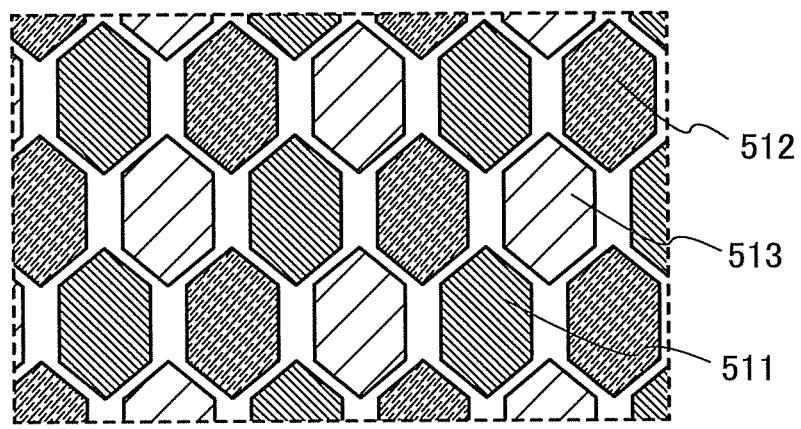
FIGS. 8A and 8B are plan views illustrating a manufacturing process of a light-emitting device of the present invention.
Figure 8B:
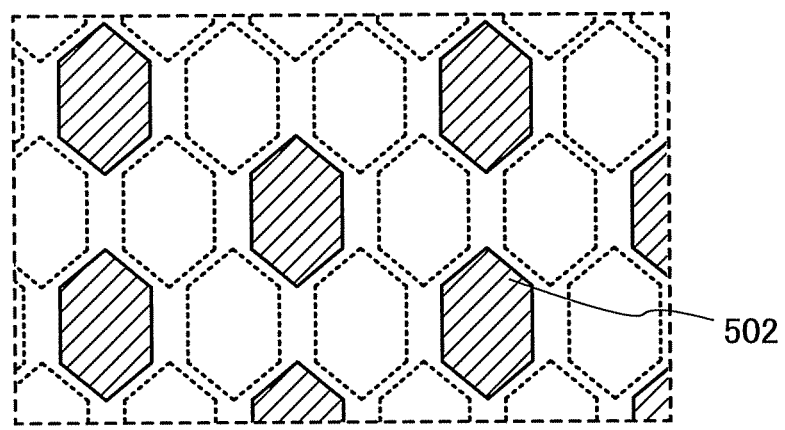

In addition, there is no particular limitation on the arrangement of pixels. The shape of each pixel may be a polygon, for example, a hexagon as illustrated in FIG. 8A, and a full-color light-emitting device may be realized by arrangement of an EL layer (R) 511, an EL layer (G) 512, and an EL layer (B) 513. In order to form polygonal pixels illustrated in FIG. 8A, deposition may be performed using a deposition substrate having polygonal light-absorbing layers 502 illustrated in FIG. 8B.

In the manufacture of the light-emitting device which is capable of full-color display described in this embodiment mode, by control of the thickness of the material layer formed over the deposition substrate, the thickness of a film which is to be deposited onto the deposition target substrate can be controlled. In other words, the thickness of the material layer formed over the deposition substrate is controlled in advance so that a film which is to be formed on the deposition target substrate can have a desired thickness by deposition of all materials contained in the material layer formed over the light-absorbing layer; thus, a thickness monitor is not needed at the time of deposition on the deposition target substrate. Therefore, a user does not need to adjust the deposition rate with a thickness monitor, and the deposition process can be fully automated. Accordingly, productivity can be increased.

Further, in the manufacture of the light-emitting device which is capable of full-color display described in this embodiment mode, by application of the present invention, a material contained in the material layer formed over the deposition substrate can be uniformly deposited. Moreover, even in the case where the material layer contains a plurality of materials, a film containing the same materials at substantially the same weight ratios as those of the material layer can be deposited onto the deposition target substrate. Thus, as for the deposition method according to the present invention, even in the case where deposition is performed using a plurality of materials having different deposition temperatures, unlike co-evaporation, the evaporation rate of each material does not need to be controlled. Thus, without complicated control of the evaporation rate or the like, a layer containing desired different materials can be deposited easily with high accuracy.

Further, in the manufacture of the light-emitting device which is capable of full-color display described in this embodiment mode, by application of the present invention, a desired material can be deposited onto the deposition target substrate without being wasted. Thus, material use efficiency is increased, which can lead to reduction in manufacturing cost. Moreover, a material can be prevented from being attached to an inner wall of a deposition chamber, and thus maintenance of a deposition apparatus can be facilitated.

Further, in the manufacture of the light-emitting device which is capable of full-color display described in this embodiment mode, by application of the present invention, a film which is flat and has no unevenness can be formed. In addition, since a minute pattern can be formed, a high-definition light-emitting device can be obtained.

Further, since the application of the present invention enables selective deposition onto a desired region at the time of deposition using laser light, material use efficiency can be increased and a film can be easily deposited in a desired shape with high accuracy; thus, productivity of the light-emitting device can be increased. Moreover, in the present invention, laser light having a high output can be used as a light source, and thus deposition on a large area can be performed at a time. Thus, time taken for deposition (takt time) can be shortened, which can lead to increase in productivity.

Note that the structure described in this embodiment mode can be combined with the structure described in Embodiment Mode 1 or 2 as appropriate.

Embodiment Mode 4

In this embodiment mode, a method for forming a light-emitting element and manufacturing a light-emitting device by application of the present invention will be described.

Figure 9A:
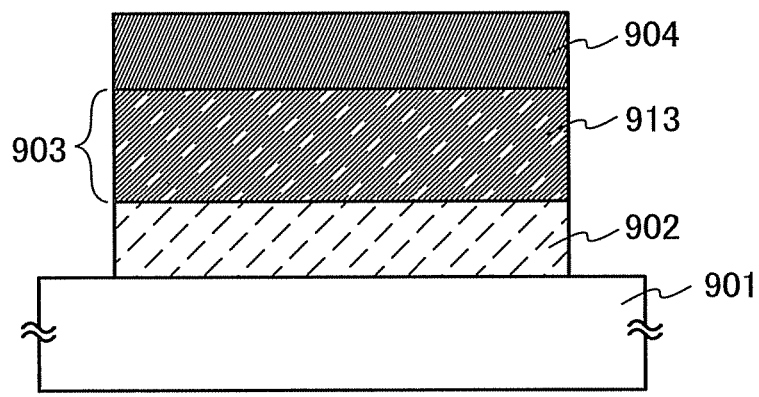
FIGS. 9A and 9B are cross-sectional views each illustrating a structure of a light-emitting element which can be applied to the present invention.
Figure 9B:
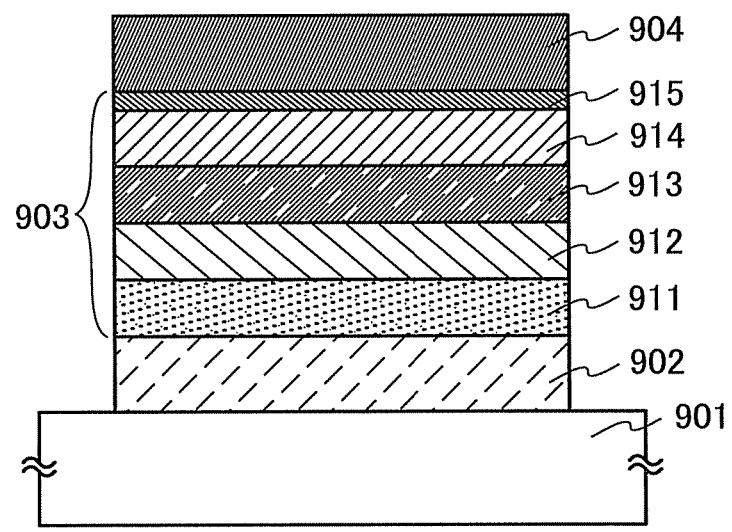

For example, light-emitting elements illustrated in FIGS. 9A and 9B can be formed by application of the present invention. In the light-emitting element illustrated in FIG. 9A, a first electrode 902, an EL layer 903 which includes only a light-emitting layer 913, and a second electrode 904 are stacked in this order over a substrate 901. One of the first electrode 902 and the second electrode 904 functions as an anode, and the other functions as a cathode. Holes injected from an anode and electrons injected from a cathode are recombined in the EL layer 903, whereby light can be emitted. In this embodiment mode, the first electrode 902 functions as an anode and the second electrode 904 functions as a cathode.

In the light-emitting element illustrated in FIG. 9B, the EL layer 903 of FIG. 9A has a structure in which a plurality of layers are stacked. Specifically, a hole-injecting layer 911, a hole-transporting layer 912, the light-emitting layer 913, an electron-transporting layer 914, and an electron-injecting layer 915 are provided in this order from the first electrode 902 side. Note that the EL layer 903 functions by including at least the light-emitting layer 913 as illustrated in FIG. 9A; thus, not all the above-described layers do not need to be provided and the layer to be provided may be selected as appropriate.

As the substrate 901 illustrated in FIGS. 9A and 9B, a substrate having an insulating surface or an insulating substrate is employed. Specifically, any of a variety of glass substrates used in the electronics industry, such as an aluminosilicate glass substrate, an aluminoborosilicate glass substrate, or a barium borosilicate glass substrate; a quartz substrate; a ceramic substrate; a sapphire substrate; and the like can be used.

For the first electrode 902 and the second electrode 904, any of a variety of types of metals, alloys, electrically-conductive compounds, a mixture thereof, and the like can be used. Specifically, indium tin oxide (ITO), indium tin oxide containing silicon or silicon oxide, indium zinc oxide (IZO), indium oxide containing tungsten oxide and zinc oxide, and the like can be given, for example. Besides, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), and the like can be given.

These materials are generally formed by a sputtering method. For example, indium zinc oxide can be formed by a sputtering method using a target in which zinc oxide is added to indium oxide at 1 wt % to 20 wt %. Indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Alternatively, by application of a sol-gel method or the like, an inkjet method, a spin coating method, or the like may be used for the formation.

Alternatively, aluminum (Al), silver (Ag), an alloy containing aluminum, or the like can be used. Alternatively, an element belonging to Group 1 or Group 2 of the periodic table, which has a low work function, that is, an alkali metal such as lithium (Li) or cesium (Cs), an alkaline earth metal such as magnesium (Mg), calcium (Ca), or strontium (Sr), and an alloy thereof (an alloy of aluminum, magnesium, and silver, and an alloy of aluminum and lithium); a rare earth metal such as europium (Eu) or ytterbium (Yb), and an alloy thereof; and the like.

A film of an alkali metal, an alkaline earth metal, or an alloy containing the metal can be formed by a vacuum evaporation method. Alternatively, a film of an alloy containing an alkali metal or an alkaline earth metal can be formed by a sputtering method. Further alternatively, a film can be formed using a silver paste or the like by an ink-jet method or the like. Each of the first electrode 902 and the second electrode 904 is not limited to a single-layer film and can be formed as a stacked-layer film.

Note that in order to extract light emitted from the EL layer 903 to the outside, one or both of the first electrode 902 and the second electrode 904 is/are formed so as to transmit light. For example, one or both of the first electrode 902 and the second electrode 904 is/are formed using a conductive material having a light-transmitting property, such as indium tin oxide, or formed using silver, aluminum, or the like to a thickness of several nanometers to several tens of nanometers. Alternatively, the first electrode 902 or the second electrode 904 can have a stacked-layer structure including a thin film of a metal such as silver or aluminum and a thin film of a conductive material having a light-transmitting property, such as an ITO film.

Note that the EL layer 903 (the hole-injecting layer 911, the hole-transporting layer 912, the light-emitting layer 913, the electron-transporting layer 914, or the electron-injecting layer 915) of the light-emitting element described in this embodiment mode can be formed by application of the deposition method described in Embodiment Mode 1 or 2.

For example, in the case where the light-emitting element illustrated in FIG. 9A is formed, a material layer of the deposition substrate described in Embodiment Mode 1 or 2 is formed using a material which forms the EL layer 903, and the EL layer 903 is formed over the first electrode 902 over the substrate 901 with use of the deposition substrate. Then, the second electrode 904 is formed over the EL layer 903, whereby the light-emitting element illustrated in FIG. 9A can be obtained.

Any of a variety of materials can be used for the light-emitting layer 913. For example, a fluorescent compound which emits fluorescence or a phosphorescent compound which emits phosphorescence can be used.

As a phosphorescent compound which can be used for the light-emitting layer 913, the following light-emitting material can be given. For example, as a light-emitting material for blue emission, there are bis[2-(4',6'-difluorophenyl)pyridinato-N,$C^{2'}$]iridium(III)tetrakis(1-pyrazolyl)borate (FIr6), bis[2-(4',6'-difluorophenyl)pyridinato-N,$C^{2'}$]iridium(II)picolinate (FIrpic), bis[2-(3',5'-bistrifluoromethylphenyl)pyridinato-N,$C^{2'}$]iridium(III)picolinate (Ir(CF$_3$ppy)$_2$(pic)), bis[2-(4',6'-difluorophenyl)pyridinato-N,$C^{2'}$]iridium(III) acetylacetonate (FIracac), and the like. As a light-emitting material for green emission, there are tris(2-phenylpyridinato-N,$C^{2'}$)iridium(III) (Ir(ppy)$_3$), bis(2-phenylpyridinato-N,$C^{2'}$)iridium(III)acetylacetonate (Ir(ppy)$_2$(acac)), bis(1,2-diphenyl-1H-benzimidazolato)iridium(III)acetylacetonate (Ir(pbi)$_2$(acac)), bis(benzo[h]quinolinato)iridium(III)acetylacetonate (Ir(bzq)$_2$(acac)), and the like. As a light-emitting material for yellow emission, there are bis(2,4-diphenyl-1,3-oxazolato-N,$C^{2'}$)iridium(II)acetylacetonate (Ir(dpo)$_2$(acac)), bis[2-(4'-(perfluorophenylphenyl)pyridinato]iridium(IEI) acetylacetonate (Ir(p-PF-ph)$_2$(acac)), bis(2-phenylbenzothiazolato-N,$C^{2'}$)iridium(III) acetylacetonate (Ir(bt)$_2$(acac)), and the like. As a light-emitting material for orange emission, there are tris(2-phenylquinolinato-N,$C^{2'}$)iridium (III) (Ir(pq)$_3$), bis(2-phenylquinolinato-N,$C^{2'}$)iridium(III) acetylacetonate (Ir(pq)$_2$(acac)), and the like. As a light-emitting material for red emission, there are organic metal complexes such as bis[2-(2'-benzo[4,5-α]thienyl)pyridinato-N,$C^3$)iridium(III)acetylacetonate (Ir(btp)$_2$(acac)), bis(1-phenylisoquinolinato-N,$C^{2'}$)iridium(III)acetylacetonate (Ir(piq)$_2$(acac), (acetylacetonato)bis[2,3-bis(4-fluorophenyl) quinoxalinato]iridium(II) (Ir(Fdpq)$_2$(acac)), and 2,3,7,8,12, 13,17,18-octaethyl-21H,23H-porphine platinum(II) (PtOEP). In addition, rare earth metal complexes such as tris(acetylacetonato)(monophenanthroline)terbium(III)(Tb (acac)$_3$(Phen)), tris(1,3-diphenyl-1,3-propanedionato) (monophenanthroline)europium(R) (Eu(DBM)$_3$(Phen)), and tris[1-(2-thenoyl)-3,3,3-trifluoroacetonato](monophenanthroline)europium(III) (Eu(TTA)$_3$(Phen)) perform light emission from a rare earth metal ion (electron transition between different multiplicities); therefore, such rare earth metal complexes can be used as phosphorescent compounds.

As a fluorescent compound which can be used for the light-emitting layer 913, the following light-emitting material can be given. For example, as a light-emitting material for blue emission, there are N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), and the like. As a light-emitting material for green emission, there are N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), N-(9,10-diphenyl-2-anthryl)-N,N',N'-triphenyl-1,4-phenylenediamine 2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)]-N-[4-(9H-carbazol-9-yl)phenyl]-N-phenylanthracen-2-amine (2YGABPhA), N,N,N',N'-triphenylanthracen-9-amine (DPhAPhA), and the like. As a light-emitting material for yellow emission, there are rubrene, 5,12-bis(1,1'-biphenyl-4-yl)-6,11-diphenyltetracene (BPT), and the like. As a light-emitting material for red emission, there are N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-diamine (p-mPhAFD), and the like.

Alternatively, the light-emitting layer 913 can have a structure in which a substance having a high light-emitting property (a dopant material) is dispersed in another substance (a host material). The use of the structure in which a substance having a high light-emitting property (a dopant material) is dispersed in another substance (a host material) makes it possible to suppress crystallization of the light-emitting layer. Moreover, concentration quenching due to high concentration of a substance having a high light-emitting property can be suppressed.

As the substance in which a substance having a high light-emitting property is dispersed, in the case where the substance having a high light-emitting property is a fluorescent compound, a substance having singlet excitation energy (the energy difference between a ground state and a singlet excited state) which is higher than the fluorescent compound is preferably used. In addition, in the case where the substance having a high light-emitting property is a phosphorescent compound, a substance having triplet excitation energy (the energy difference between a ground state and a triplet excited state) which is higher than the phosphorescent compound is preferably used.

As the host material used for the light-emitting layer 813, for example, there are 4,4'-di(9-carbazolyl)biphenyl (CBP), 2-tert-butyl-9,10-di(2-naphthyl)anthracene (t-BuDNA), 9-[4-(9-carbazolyl)phenyl]-10-phenylanthracene (CzPA), and the like as well as 4,4'-bis[N-(1-naphthyl)-N-phenylamino]biphenyl (NPB), tris(8-quinolinolato)aluminum(III) (Alq), 4,4'-bis[N-(9,9-dimethylfluoren-2-yl)-N-phenylamino]biphenyl (DFLDPBi), bis(2-methyl-8-quinolinolato)(4-phenylphenolato)aluminum(III) (BAlq), and the like.

As the dopant material, any of the above-described phosphorescent compounds or fluorescent compounds can be used.

In the case where the light-emitting layer 913 has a structure in which a substance having a high light-emitting property (a dopant material) is dispersed in another substance (a host material), a mixed layer of a host material and a guest material is formed as the material layer over the deposition substrate. Alternatively, the material layer over the deposition substrate may have a structure in which a layer containing a host material and a layer containing a dopant material are stacked. Formation of the light-emitting layer 913 by using a deposition substrate with the material layer having such a structure, the light-emitting layer 913 contains a substance in which a light-emitting material is dispersed (a host material) and a substance having a high light-emitting property (a dopant material), and has a structure in which the substance having a high light-emitting property (a dopant material) is dispersed in the substance in which a light-emitting material is dispersed (a host material). Note that for the light-emitting layer 913, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 9B is formed, the deposition substrate described in Embodiment Mode 1 or 2, which has a material layer formed using a material for forming each layer in the EL layer 903 (the hole-injecting layer 911, the hole-transporting layer 912, the light-emitting layer 913, the electron-transporting layer 914, and the electron-injecting layer 915), is prepared for each layer, and deposition of each layer is performed using a different deposition substrate by the method described in Embodiment Mode 1 or 2, whereby the EL layer 903 is formed over the first electrode 902 over the substrate 901. Then, the second electrode 904 is formed over the EL layer 903; thus, the light-emitting element illustrated in FIG. 9B can be obtained. Note that, although all the layers in the EL layer 903 can be formed by the method described in Embodiment Mode 1 or 2 in this case, only some of the layers in the EL layer 903 may be formed by the method described in Embodiment Mode 1 or 2.

In the case where films are stacked over a deposition target substrate by a wet process, since a liquid composition containing a material is directly attached to a lower film to form a film, the lower film is dissolved depending on a solvent contained in the composition; thus, a material which can be stacked is limited. However, in the case where films are stacked by a deposition method of the present invention, a solvent is not directly attached to a lower film, and thus effects of the solvent on the lower film do not need to be considered. Therefore, a material which can be stacked can be selected freely. Further, although heat treatment for removing a solvent and improving the film quality is preferably performed in the case where deposition is performed by a wet process, when a film is directly formed on a deposition target substrate by a wet process, heat treatment has to be performed under the condition that a film of a lower layer which has been already formed on the deposition target substrate is not affected; thus, the film quality cannot be sufficiently improved in some cases.

For example, the hole-injecting layer 911 can be formed using molybdenum oxide, vanadium oxide, ruthenium oxide, tungsten oxide, manganese oxide, or the like. Alternatively, the hole-injecting layer 911 can be formed using a phthalocyanine-based compound such as phthalocyanine ($H_2Pc$) or copper phthalocyanine (CuPc), a high molecule such as poly(3,4-ethylenedioxythiophene)/poly(styrenesulfonic acid) (PEDOT/PSS), or the like.

As the hole-injecting layer 911, a layer which contains a substance having a high hole-transporting property and a substance having an electron-accepting property can be used. The layer which contains a substance having a high hole-transporting property and a substance having an electron-accepting property has high carrier density and an excellent hole-injecting property. The layer which contains a substance having a high hole-transporting property and a substance having an electron-accepting property is used as a hole-injecting layer which is in contact with an electrode which functions as an anode, whereby any of a variety of kinds of metals, alloys, electrically-conductive compounds, a mixture thereof, and the like can be used for the electrode regardless of the magnitude of work function of a material of the electrode which functions as an anode.

As the substance having an electron-accepting property, which is used for the hole-injecting layer 911, 7,7,8,8-tetracyano-2,3,5,6-tetrafluoroquinodimethane (F4-TCNQ), chloranil, and the like can be given. In addition, a transition metal oxide can be given. Moreover, oxides of metals belonging to Group 4 to Group 8 can be given. Specifically, vanadium oxide, niobium oxide, tantalum oxide, chromium oxide, molybdenum oxide, tungsten oxide, manganese oxide, and rhenium oxide are preferable because of their high electron-accepting properties. Above all, molybdenum oxide is particularly preferable because it is stable even in the atmospheric air, has a low hygroscopic property, and is easy to be handled.

As the substance having a high hole-transporting property used for the hole-injecting layer 911, any of a variety of compounds such as an aromatic amine compound, a carbazole derivative, an aromatic hydrocarbon, and a high molecular compound (such as oligomer, dendrimer, and polymer) can be used. Note that it is preferable that the substance having a high hole-transporting property used for the hole-injecting layer be a substance having a hole mobility of greater than or equal to $10^{-6}$ $cm^2/Vs$. However, substances other than those may be used as long as the hole-transporting properties thereof are higher than the electron-transporting properties thereof. Specific examples of the substance having a high hole-transporting property, which can be used for the hole-injecting layer 911, are given below.

As the aromatic amine compound which can be used for the hole-injecting layer 911, for example, the following can be used,: 4,4'-bis[N-(1-naphthyl)-N-phenylamino]biphenyl (NPB), N,N'-bis(3-methylphenyl)-N,N-diphenyl-[1,1'-biphenyl]-4,4'-diamine (TPD), 4,4',4"-tris(N,N-diphenylamino)triphenylamine (TDATA), 4,4',4"-tris[N-(3-methylphenyl)-N-phenylamino]tiphenylamine (MTDATA), 4,4'-bis[N-(spiro-9,9'-bifluoren-2-yl)-N-phenylamino]biphenyl (BSPB), or the like. In addition, the following can be given: N,N'-bis(4-methylphenyl)(p-tolyl)-N,N'-diphenyl-p-phenylenediamine (DTDPPA), 4,4'-bis[N-(4-diphenylaminophenyl)-N-phenylainino]biphenyl (DPAB), 4,4'-bis(N-{4-[N'-(3-methylphenyl)-N'-phenylamino]phenyl}-N- phenylamino)biphenyl (DNTPD), 1,3,5-tris[N-(4-diphenylaminophenyl)-N-phenylamino]benzene (DPA3B), and the like.

As the carbazole derivative which can be used for the hole-injecting layer 911, the following can be specifically given: 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and the like.

In addition, as the carbazole derivative which can be used for the hole-injecting layer 911, the following can be given: 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4-(N-carbazolyl)phenyl]-2,3,5,6-tetraphenylbenzene, and the like.

As the aromatic hydrocarbon which can be used for the hole-injecting layer 911, the following can be given, for example: 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphtlhyl)anthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. In addition, pentacene, coronene, and the like can also be used. As described above, an aromatic hydrocarbon having a hole mobility of greater than or equal to $1 \times 10^{-6}$ cm$^2$/Vs and having 14 to 42 carbon atoms is preferably used.

The aromatic hydrocarbon which can be used for the hole-injecting layer 911 may have a vinyl skeleton. As the aromatic hydrocarbon which has a vinyl skeleton, for example, 4,4'-bis(2,2-diphenylvinyl)biphenyl (DPVBi), 9,10-bis[4-(2,2-diphenylvinyl)phenyl]anthracene (DPVPA), and the like can be given.

Moreover, the layer which contains a substance having a high hole-transporting property and a substance having an electron-accepting property has not only an excellent hole-injecting property but also an excellent hole-transporting property; thus, the above-described hole-injecting layer 911 may be used as a hole-transporting layer.

The hole-transporting layer 912 contains a substance having a high hole-transporting property. As the substance having a high hole-transporting property, for example, an aromatic amine compound such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino]triphenylamine (MTDATA), or 4,4'-bis[N-(spiro-9,9'-bifluoren-2-yl)-N-phenylamino]biphenyl (BSPB), or the like can be used. The substances described here are mainly substances having a hole mobility of greater than or equal to $10^{-6}$ cm$^2$/Vs. However, substances other than those may be used as long as the hole-transporting properties thereof are higher than the electron-transporting properties thereof. Note that the layer which contains a substance having a high hole-transporting property is not limited to a single layer, but two or more layers each of which is formed using the above-described substance may be stacked.

The electron-transporting layer 914 contains a substance having a high electron-transporting property. As the substance having a high electron-transporting property, for example, a metal complex having a quinoline skeleton or a benzoquinoline skeleton, such as tris(8-quinolinolato)aluminum (Alq); tris(4-methyl-8-quinolinolato)aluminum (Almq$_3$); bis(10-hydroxybenzo[h]quinolinato)beryllium (BeBq$_2$), or bis(2-methyl-8-quinolinolato)(4-phenylphenolato)aluminum (BAlq) can be used. Alternatively, a metal complex having an oxazole-based ligand or a thiazole-based ligand, such as bis[2-(2-hydroxyphenyl)benzoxazolato]zinc (Zn(BOX)$_2$) or bis[2-(2-hydroxyphenyl)benzothiazolato] zinc (Zn(BTZ)$_2$) can be used. Further alternatively, besides the metal complexes, 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ01), bathophenanthroline (BPhen), bathocuproine (BCP), or the like can be used. The substances described here are mainly substances having an electron mobility of greater than or equal to $10^{-6}$ cm$^2$/Vs. Note that substances other than those may be used as long as the electron-transporting properties thereof are higher than the hole-transporting properties thereof. In addition, the electron-transporting layer is not limited to a single layer, but two or more layers each of which is formed using the above-described substance may be stacked.

As the electron-injecting layer 915, a compound of an alkali metal or an alkaline earth metal such as lithium fluoride (LiF), cesium fluoride (CsF), or calcium fluoride (CaF2) can be used. Alternatively, a layer in which a substance having an electron-transporting property is combined with an alkali metal or an alkaline earth metal can be used. For example, a layer containing Alq and magnesium (Mg) can be used. Note that it is preferable that a layer in which a substance having an electron-transporting property is combined with an alkali metal or an alkaline earth metal be used as the electron-injecting layer 915 because electrons are efficiently injected from the second electrode 904.

Note that there is no particular limitation on a stacked-layer structure of the EL layer 903. The EL layer 903 may be formed by an appropriate combination of a light-emitting layer with any of layers which contain a substance having a high electron-transporting property, a substance having a high hole-transporting property, a substance having a high electron-injecting property, a substance having a high hole-injecting property, a bipolar substance (a substance having a high electron-transporting property and a high hole-transporting property), and the like.

Light emission from the EL layer 903 is extracted to the outside through one or both of the first electrode 902 and the second electrode 904. Therefore, one of or both the first electrode 902 and the second electrode 904 is/are an electrode having a light-transmitting property. When only the first electrode 902 is an electrode having a light-transmitting property, light is extracted from the substrate 901 side through the first electrode 902. When only the second electrode 904 is an electrode having a light-transmitting property, light is extracted from a side opposite to the substrate 901 through the second electrode 904. When both the first electrode 902 and the second electrode 904 are electrodes having light-transmitting properties, light is extracted from both the substrate 901 side and the side opposite thereto through the first electrode 902 and the second electrode 904, respectively.

Note that, although FIGS. 9A and 9B illustrate the structure in which the first electrode 902 which functions as an anode is provided on the substrate 901 side, the second electrode 904 which functions as a cathode may be provided on the substrate 901 side.

The EL layer 903 is formed by the deposition method described in Embodiment Mode 1 or 2 or may be formed by a combination of the deposition method described in Embodiment Mode 1 or 2 with another deposition method. In addition, a different deposition method may be used for each layer. As a dry process, a vacuum evaporation method, an electron beam evaporation method, a sputtering method, and the like are given. As a wet process, an ink-jet method, a spin coating method, and the like are given.

In a light-emitting element and a light-emitting device according to this embodiment mode, an EL layer to which the present invention is applied can be formed. Accordingly, a highly accurate film can be formed efficiently. Therefore, not only can characteristics of the light-emitting element be improved, but also yield can be increased and cost can be reduced.

This embodiment mode can be combined with any of embodiment modes described above.

Embodiment Mode 5

In this embodiment mode, a passive matrix light-emitting device manufactured using the present invention will be described with reference to FIGS. 2A and 2B, FIGS. 3A and 3B, FIGS. 4A to 4F, FIGS. 5A to 5C, and FIGS. 6A to 6F.

Figure 2A:
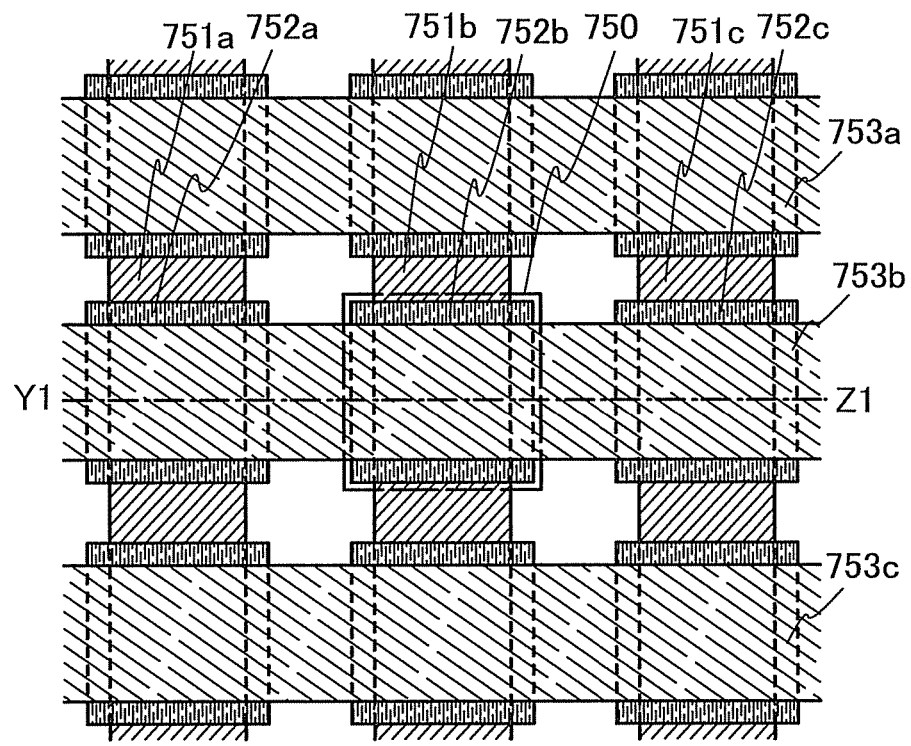
FIG. 2A is a plan view illustrating a light-emitting device of the present invention and FIG. 2B is a cross-sectional view illustrating the same.
Figure 2B:
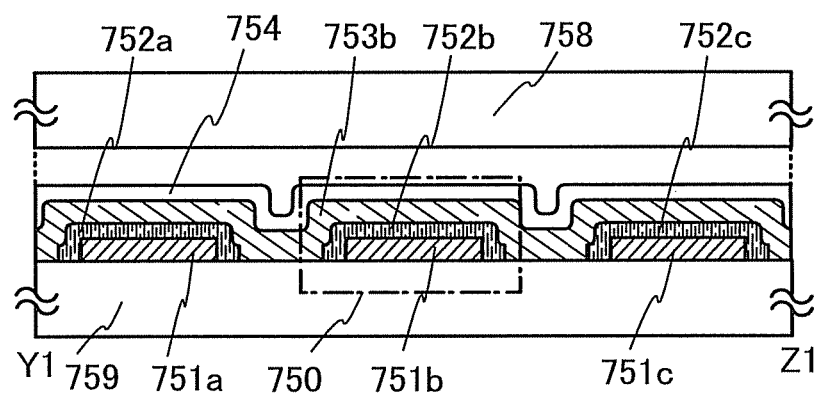

FIGS. 2A and 2B illustrate a light-emitting device having a passive matrix light-emitting element to which the present invention is applied. FIG. 2A is a plan view of the light-emitting device. FIG. 2B is a cross-sectional view taken along the line Y1-Z1 in FIG. 2A.

The light-emitting device illustrated in FIG. 2A has, over an element substrate 759, first electrode layers 751a, 751b, and 751c each of which is extended in the first direction and is an electrode layer used for the light-emitting element; EL layers 752a, 752b, and 752c which are selectively formed over the first electrode layers 751a, 751b, and 751c, respectively; and second electrode layers 753a, 753b, 753c each of which is extended in the second direction perpendicular to the first direction and is an electrode layer used for the light-emitting element. An insulating layer 754 which functions as a protective film is provided so as to cover the second electrode layers 753a, 753b, and 753c (see FIGS. 2A and 2B).

In FIGS. 2A and 2B, the first electrode layer 751b which functions as a data line (a signal line) and the second electrode layer 753b which functions as a scanning line (a source line) intersect with each other with the EL layer 752b interposed therebetween to form a light-emitting element 750.

In this embodiment mode, as described in Embodiment Mode 1, the EL layers 752a, 752b, and 752c are formed using the deposition method of the present invention. A method for manufacturing the light-emitting device of this embodiment mode illustrated in FIGS. 2A and 2B will be described with reference to FIGS. 4A to 4F.

FIG. 4A illustrates a deposition substrate having a similar structure to that illustrated in FIG. 1A described in Embodiment Mode 1. In this embodiment mode, an insulating film 702 is formed as a base film over a first substrate 701 which is a deposition substrate, and a light-absorbing layer 704 is selectively formed over the insulating film 702. The insulating film 702 is provided in order to prevent impurities such as sodium ions from being dispersed from the first substrate 701 and contaminating the light-absorbing layer or a material layer. However, in the case where there is no need to worry about diffusion of impurities from the first substrate 701, which have an adverse effect on the light-absorbing layer or the material layer, the insulating film 702 can be omitted.

The insulating film 702 may have a single layer structure or a layered structure including, for example, two or three layers, using an inorganic insulating material such as silicon oxide, silicon nitride, silicon oxynitride, silicon nitride oxide, and the like. Note that silicon oxynitride means a substance in which the amount of oxygen is higher than that of nitrogen, and can also be referred to as silicon oxide containing nitrogen. Similarly, silicon nitride oxide means a substance in which the amount of nitrogen is higher than that of oxygen and can also be referred to as silicon nitride containing oxygen. In this embodiment mode, a silicon oxide film is used as the insulating film 702.

Particles 161 containing an organic compound material are dispersed over the first substrate 701, the insulating film 702, and the light-absorbing layer 704 (see FIG. 4B).

Heat treatment is performed on the particles 161 containing an organic compound material to fix the particles 161 containing an organic compound material onto the first substrate 701, the insulating film 702, and the light-absorbing layer 704, so that a material layer 705 is formed over the first substrate 701, the insulating film 702, and the light-absorbing layer 704 (see FIG. 4C). In the present invention, the particles 161 containing an organic compound material deposited over (attached to) the first substrate 701, the insulating film 702, and the light-absorbing layer 704 are fixed over the entire area by the heat treatment, so that the material layer 705 is formed.

The first electrode layers 751a, 751b, and 751c are formed on the element substrate 759 which is a deposition target substrate. The element substrate 759 and the first substrate 701 are placed so that the first electrode layers 751a, 751b, and 751c face the material layer 705 (see FIG. 4D).

Irradiation with light 710 is performed from a rear surface (a surface opposite to the surface over which the material layer 705 is formed) of the first substrate 701, so that at least a part of the material contained in the material layer 705 is deposited onto the element substrate 759 as the EL layers 752a, 752b, and 752c due to heat given by the light-absorbing layer 704 (see FIG. 4E). Through the above-described steps, the EL layers 752a, 752b, and 752c are selectively formed over the first electrode layers 751a, 751b, and 751c provided over the first substrate 701, respectively (see FIG. 4F).

The second electrode layer 753b and the insulating layer 754 are formed over the EL layers 752a, 752b, and 752c illustrated in FIG. 4F, and sealing is performed using a sealing substrate 758, whereby the light-emitting device illustrated in FIG. 2B can be completed.

The light-emitting device illustrated in FIGS. 2A and 2B is an example in which the sizes of the EL layers 752a, 752b, and 752c are larger than the widths (the widths in the direction of Y1-Z1) of the first electrode layers 751a, 751b, and 751c, and the EL layers 752a, 752b, and 752c cover edges of the first electrode layers 751a, 751b, and 751c, respectively. This is because the width of the pattern of the light-absorbing layer selectively formed in FIGS. 4A to 4F is set to be larger than that of the pattern of its corresponding first electrode layer.

Figure 3A:
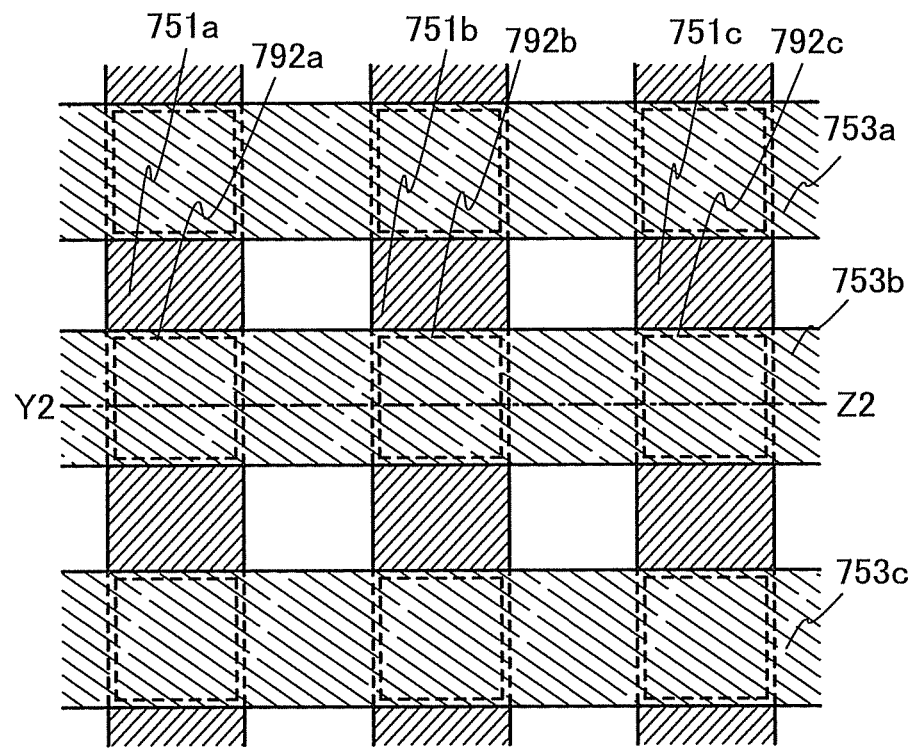
FIG. 3A is a plan view illustrating a light-emitting device of the present invention and FIG. 3B is a cross-sectional view illustrating the same.
Figure 3B:
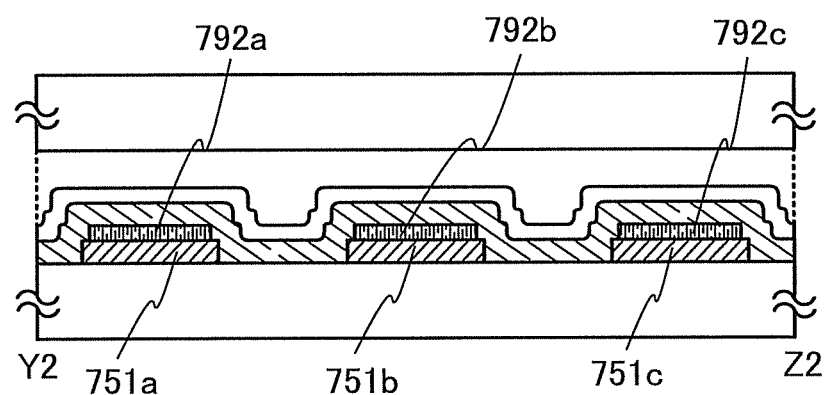

FIGS. 3A and 3B illustrate an example in which the whole area of an EL layer is formed over the first electrode. FIG. 3A is a plan view of the light-emitting device. FIG. 3B is a cross-sectional view taken along the line Y2-Z2 in FIG. 2A. In the light-emitting device illustrated in FIGS. 3A and 3B, the sizes of EL layers 792a, 792b, and 792c are smaller than those of the first electrode layers 751a, 751b, and 751c; thus, the whole areas of the EL layers 792a, 792b, and 792c are formed over the first electrode layers 751*a*, 751*b*, and 751*c*, respectively. By a deposition method of the present invention, a film is deposited onto the deposition target substrate, reflecting a pattern of the light-absorbing layer selectively formed over the deposition substrate. Thus, when the pattern of the material layer formed over the light-absorbing layer is set to be smaller than the first electrode layers 751*a*, 751*b*, and 752*c*, films can be deposited in shapes like those of the EL layers 792*a*, 792*b*, and 792*c*.

Further, in the passive matrix light-emitting device, a partition wall (an insulating layer) for separating the light-emitting elements may be provided. An example of a light-emitting device having a partition wall having two layers is illustrated in FIGS. 5A and 5B and FIGS. 6A to 6E.

Figure 5A:
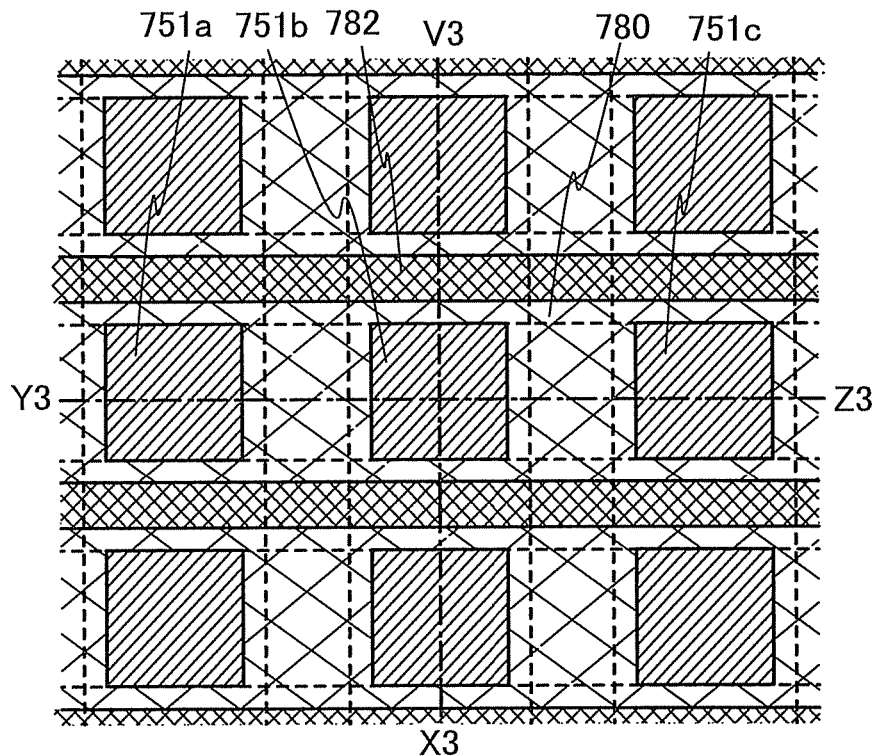
FIG. 5A is a plan view illustrating a light-emitting device of the present invention and FIGS. 5B and 5C are cross-sectional views illustrating the same.
Figure 5B:
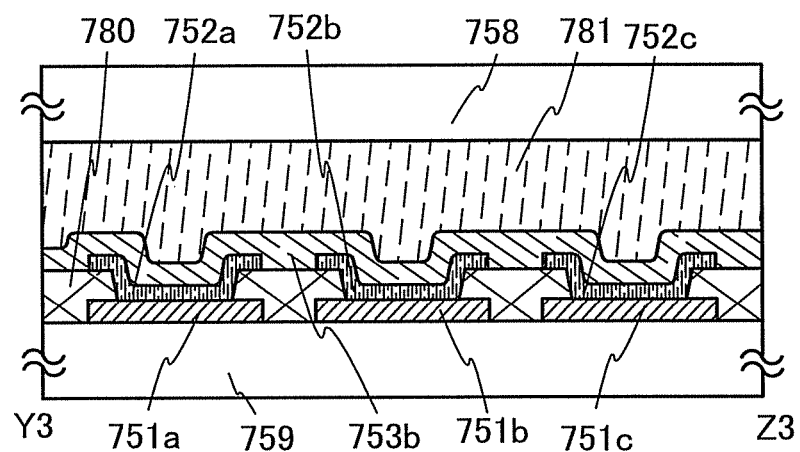
Figure 5C:
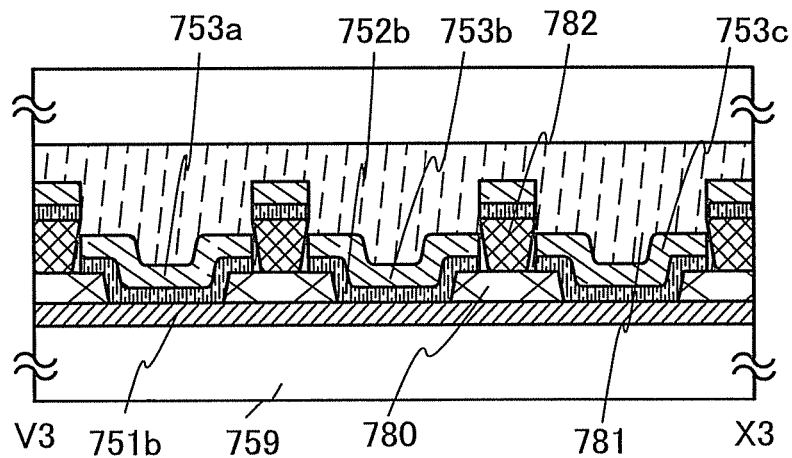

FIG. 5A is a plan view of the light-emitting device. FIG. 5B is a cross-sectional view taken along the line Y3-Z3 in FIG. 5A. FIG. 5C is a cross-sectional view taken along the line V3-X3 in FIG. 5A. Note that FIG. 5A is a plan view illustrating steps up to and including formation of a partition wall 782, and the EL layer and the second electrode layer are omitted.

As illustrated in FIGS. 5A to 5C, over the first electrode layers 751*a*, 751*b*, and 751*c*, a partition wall 780 is selectively formed having openings in pixel regions. As illustrated in FIG. 5B, the partition wall 780 is formed having a tapered shape so as to cover edges of the first electrode layers 751*a*, 751*b*, and 751*c*.

The partition wall 782 is selectively formed over the partition wall 780. As illustrated in FIG. 5C, with the partition wall 782, the EL layer and the second electrode layer are sectioned so that each section of the EL layer and the second electrode layer is separated. The sidewalls of the partition wall 782 have such inclination that the distance between one of the sidewalls and the other thereof is decreased toward the surface of the substrate. That is, the shape of a cross section of the partition wall in the direction of its short side is trapezoid, where the bottom side (the side is in contact with the partition wall 780) is shorter than the top side (the side is not in contact with the partition wall 780). Since the partition wall 782 has a so-called inversely tapered shape, the EL layer 752*b* is sectioned by the partition wall 782 in a self alignment manner, and thus the EL layer 752*b* can be selectively formed over the first electrode layer 751*b*. Thus, adjacent light-emitting elements are separated without being processed by etching and electrical defects such as a short circuit between the light-emitting elements can be prevented.

A method for manufacturing the light-emitting device of this embodiment mode illustrated in FIG. 5B, using a deposition method of the present invention will be described with reference to FIGS. 6A to 6E.

Figure 6A:
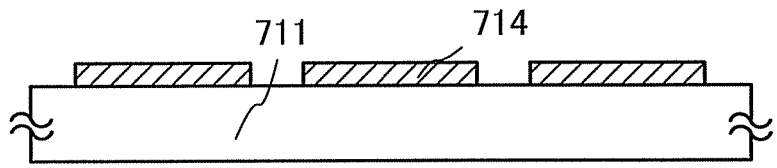
FIGS. 6A to 6F are cross-sectional views illustrating a manufacturing process of a light-emitting device of the present invention.

FIG. 6A illustrates a deposition substrate having a similar structure to that illustrated in FIG. 1A described in Embodiment Mode 1. A light-absorbing layer 714 is selectively formed over a first substrate 711 which is a deposition substrate.

Figure 6B:
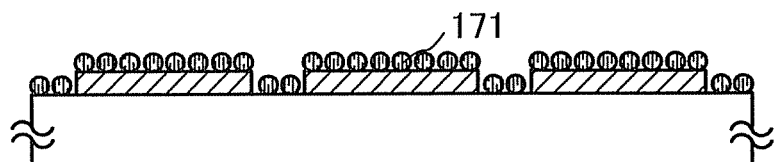

Particles 171 containing an organic compound material are dispersed over the first substrate 711 and the light-absorbing layer 714 (see FIG. 6B).

Figure 6C:
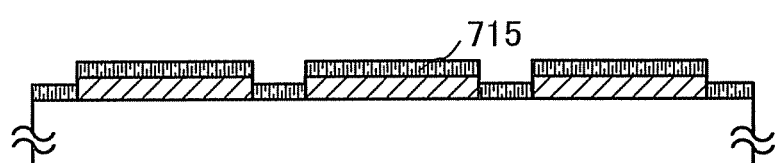
Figure 6D:
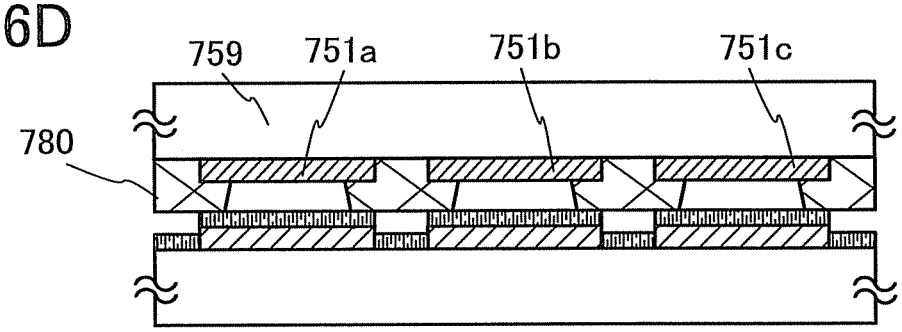

Heat treatment is performed on the particles 171 containing an organic compound material to fix the particles 171 containing an organic compound material onto the first substrate 711 and the light-absorbing layer 714, so that a material layer 715 is formed over the first substrate 711 and the light-absorbing layer 714 (see FIG. 6C). In the present invention, the particles 171 containing an organic compound material deposited over (attached to) the first substrate 711 and the light-absorbing layer 714 are fixed over the entire area by the heat treatment, so that the material layer 715 is formed.

The first electrode layers 751*a*, 751*b*, and 751*c* are formed on the element substrate 759 which is a deposition target substrate. The element substrate 759 and the first substrate 711 are placed so that the first electrode layers 751*a*, 751*b*, and 751*c*, and the partition wall 780 face the material layer 715 (see FIG. 6D). The first substrate 711 and the element substrate 759 are placed having the distance d therebetween which is so short that the material layer 715 over the first substrate 711, which is the outermost surface and the partition wall 780 over the element substrate 759, which is the outermost surface are partially in contact with each other. As described above, in the case where the layers which are the outermost surfaces of the first substrate 711 and the element substrate 759 have unevenness, there is a region where the outermost surface layers are in contact and a region where they are not in contact in some cases.

Figure 6E:
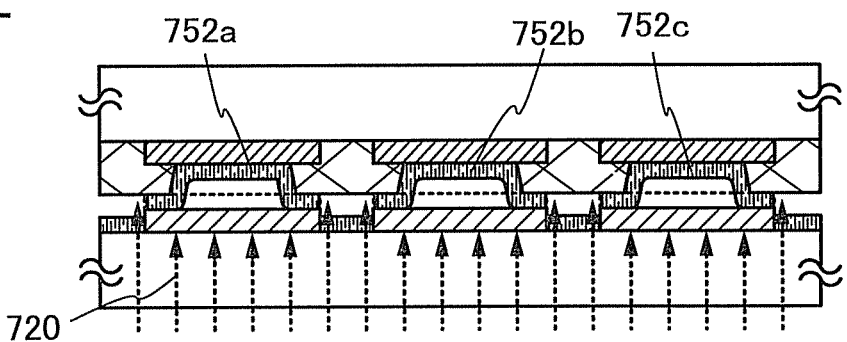

Irradiation with the light 710 is performed from a rear surface (a surface opposite to the surface over which the material layer 715 is formed) of the first substrate 711, so that at least a part of the material contained in the material layer 715 is deposited onto the element substrate 759 as the EL layers 752*a*, 752*b*, and 752*c* due to heat given by the light-absorbing layer 714 (see FIG. 6E). Through the above-described steps, the EL layers 752*a*, 752*b*, and 752*c* can be selectively formed over the first electrode layers 751*a*, 751*b*, and 751*c* provided over the first substrate 701, respectively (see FIG. 6F). By reduction in the distance d, the shapes of the EL layers 752*a*, 752*b*, and 752*c* which are deposited onto the element substrate 759 can be formed with high accuracy at the time of light irradiation.

Figure 6F:
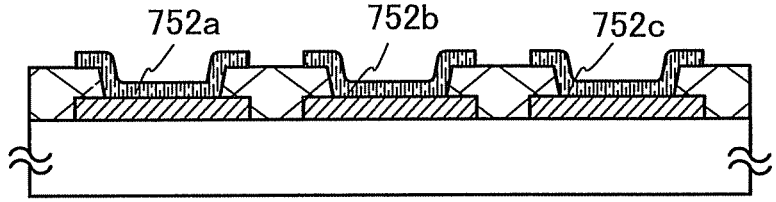

The second electrode layer 753*b* is formed over the EL layers 752*a*, 752*b*, and 752*c* illustrated in FIG. 6F; a filling layer 781 is formed; and sealing is performed using the sealing substrate 758, whereby the light-emitting device illustrated in FIG. 5B can be completed.

A glass substrate, a quartz substrate, or the like can be used as the sealing substrate 758. Alternatively, a flexible substrate may be used. The flexible substrate means a substrate that can be bent (a flexible substrate). For example, a high-molecular material elastomer, which can be processed to be shaped similarly to plastic by plasticization at high temperatures and has a property of an elastic body like rubber at room temperature, or the like can be used in addition to a plastic substrate made of polycarbonate, polyarylate, polyethersulfone, or the like. Alternatively, a film (made of polypropylene, polyester, vinyl, polyvinyl fluoride, vinyl chloride, or the like), an inorganic-deposited film, or the like can be used.

For the partition wall 780 and the partition wall 782, the following may be used: an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant polymer such as polyimide, aromatic polyamide, or polybenzimidazole; or a siloxane resin material. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. As a formation method, a vapor growth method such as a plasma CVD method or a thermal CVD method, or a sputtering method can be used. Alternatively, a droplet discharge method or a printing method can be used. A film obtained by a coating method can also be used.

Figure 10:
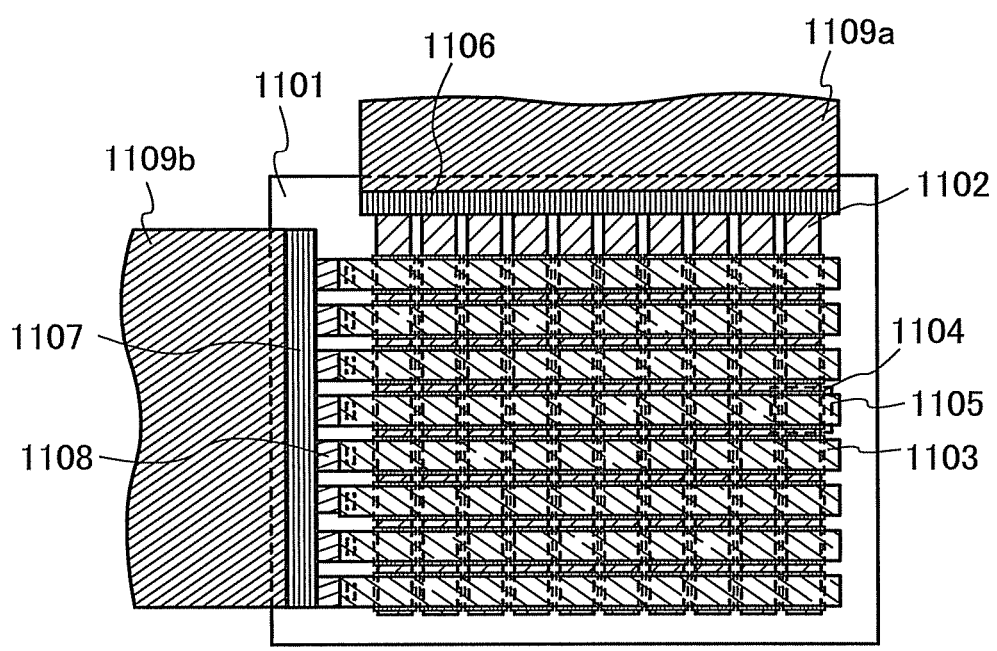
FIG. 10 is a plan view illustrating a light-emitting display module of the present invention.

Next, FIG. 10 is a plan view of a case where the passive matrix light-emitting device illustrated in FIGS. 2A and 2B is mounted with an FPC or the like.

In FIG. 10, scanning lines and data lines perpendicularly intersect in a pixel portion for displaying images.

Here, the first electrode layers 751a, 751b, and 751c in FIGS. 2A and 2B correspond to data lines 1102 in FIG. 10; the second electrode layers 753a, 753b, and 753c in FIGS. 2A and 2B correspond to scanning lines 1103 in FIG. 10; and the EL layers 752a, 752b, and 752c in FIGS. 2A and 2B correspond to EL layers 1104 in FIG. 10. The EL layer 1104 is interposed between the data line 1102 and the scanning line 1103, and an intersection portion indicated by a region 1105 corresponds to one pixel (indicated by the light-emitting element 750 in FIGS. 2A and 2B).

Note that the scanning lines 1103 are electrically connected at their ends to connecting wirings 1108, and the connecting wirings 1108 are connected to an FPC 1109b via an input terminal 1107. The data lines 1102 are connected to an FPC 1109a via an input terminal 1106.

If necessary, a polarizing plate, a circularly polarizing plate (including an elliptically polarizing plate in its category), a retardation plate (a quarter-wave plate or a half-wave plate), or an optical film such as a color filter may be provided as appropriate over a light-emitting surface. Further, a polarizing plate or a circularly polarizing plate may be provided with an anti-reflection film. For example, anti-glare treatment can be performed, by which reflected light can be diffused by projections and depressions of a surface, thereby reducing reflection.

Although FIG. 10 illustrates the example in which a driver circuit is not provided over the substrate, the present invention is not particularly limited to this example. An IC chip including a driver circuit may be mounted on the substrate.

In the case where an IC chip is mounted, a data line side IC and a scanning line side IC, each of which is provided with a driver circuit for transmitting a variety of signals to the pixel portion, are mounted on the periphery of (outside of) the pixel portion by a chip on glass (COG) method. The mounting may be performed using a tape carrier package (TCP) or a wire bonding method other than the COG method. TCP is a tape automated bonding (TAB) tape mounted with an IC, and the TAB tape is connected to a wiring over an element formation substrate to mount the IC. Each of the data line side IC and the scanning line side IC may be formed using a single crystal silicon substrate, or may be formed by formation of a driver circuit with a TFT over a glass substrate, a quartz substrate, or a plastic substrate. Although described here is an example in which a single IC is provided on one side, a plurality of divided ICs may be provided on one side.

When the present invention is used, a thin film in a minute pattern can be formed on a deposition target substrate without providing a minute mask for separating pixels between the material and the deposition target substrate. As in this embodiment mode, a light-emitting element can be formed by such a deposition method, and accordingly a high-definition light-emitting device can be manufactured.

This embodiment mode can be combined with any of embodiment modes described above.

Embodiment Mode 6

In this embodiment mode, a passive matrix light-emitting device manufactured using the present invention will be described with reference to FIGS. 2A and 2B, FIGS. 3A and 3B, FIGS. 5A to 5C, FIGS. 19A to 19G, and FIGS. 20A to 20G. An example in which the light-emitting device described in Embodiment Mode 5 is manufactured by the deposition method of Embodiment Mode 2.

In this embodiment mode, as described in Embodiment Mode 2, the EL layers 752a, 752b, and 752c are formed using the deposition method of the present invention. A method for manufacturing the light-emitting device of this embodiment mode illustrated in FIGS. 2A and 2B will be described with reference to FIGS. 19A to 19G.

Figure 19A:
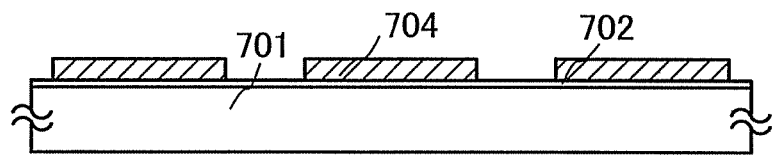
FIGS. 19A to 19G are cross-sectional views illustrating a manufacturing process of a light-emitting device of the present invention.

FIG. 19A illustrates a deposition substrate having a similar structure to that illustrated in FIG. 18A described in Embodiment Mode 2. In this embodiment mode, the insulating film 702 is formed as the base film over the first substrate 701 which is a deposition substrate, and the light-absorbing layer 704 is selectively formed over the insulating film 702.

Figure 19B:
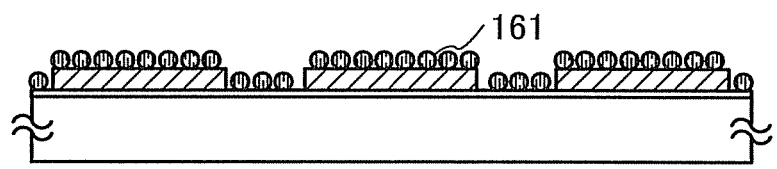

The particles 161 containing an organic compound material are dispersed over the first substrate 701, the insulating film 702, and the light-absorbing layer 704 (see FIG. 19B).

Figure 19C:
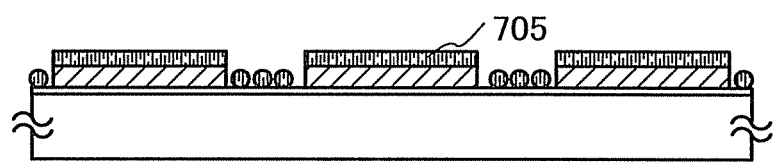

The particles 161 containing an organic compound material over the light-absorbing layer 704 are fixed by selective heat treatment, so that the material layer 705 is formed over the light-absorbing layer 704 (see FIG. 19C). Of the particles 161 containing an organic compound material deposited over (attached to) the first substrate 701 and the light-absorbing layer 704, only the particles 161 containing an organic compound material which are over the light-absorbing layer 704 are fixed by the heat treatment, so that the material layer 705 is formed. Thus, of the particles 161 containing an organic compound material which have been dispersed over the first substrate 701 and the light-absorbing layer 704, the particles 161 over the first substrate 701 remain particulate and are not fixed.

Figure 19D:
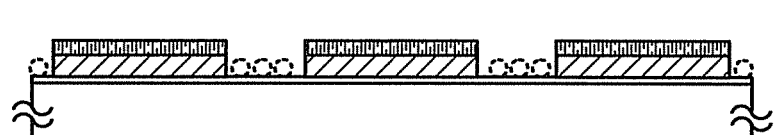
Figure 19E:
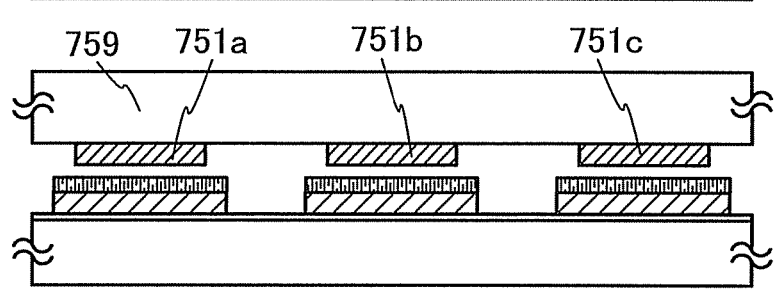

Next, of the particles 161 containing an organic compound material which have been dispersed over the first substrate 701, the insulating film 702, and the light-absorbing layer 704, the particles 161 over the first substrate 701 and the insulating film 702, which are not fixed, are removed (see FIG. 19D).

The first electrode layers 751a, 751b, and 751c are formed on the element substrate 759 which is a deposition target substrate. The element substrate 759 and the first substrate 701 are placed so that the first electrode layers 751a, 751b, and 751c face the material layer 705 (see FIG. 19E).

Figure 19F:
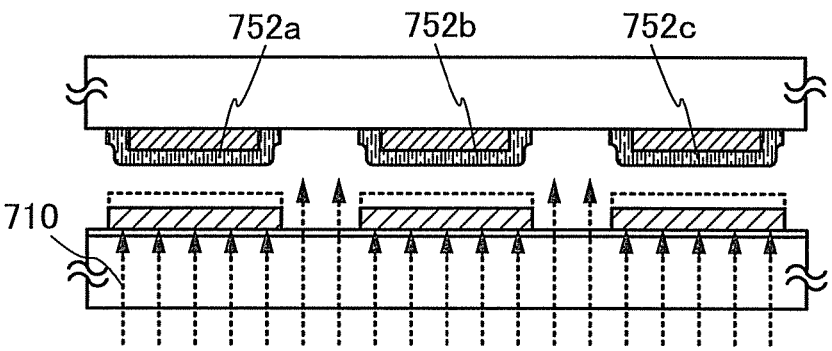
Figure 19G:
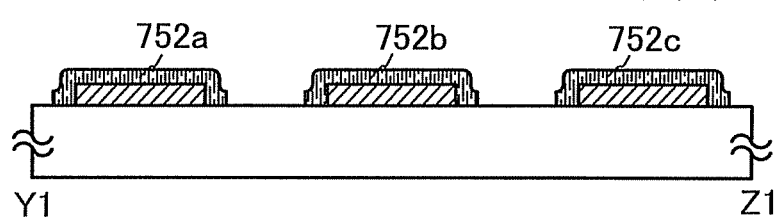

Irradiation with the light 710 is performed from the rear surface (a surface opposite to the surface over which the material layer 705 is formed) of the first substrate 701, so that at least a part of the material contained in the material layer 705 is deposited onto the element substrate 759 as the EL layers 752a, 752b, and 752c due to heat given by the light-absorbing layer 704 (see FIG. 19F). Through the above-described steps, the EL layers 752a, 752b, and 752c are selectively formed over the first electrode layers 751a, 751b, and 751c provided over the element substrate 759, respectively (see FIG. 19G).

The second electrode layer 753b and the insulating layer 754 are formed over the EL layers 752a, 752b, and 752c illustrated in FIG. 19Q and sealing is performed using the sealing substrate 758, whereby the light-emitting device illustrated in FIG. 2B can be completed.

FIGS. 3A and 3B illustrate an example in which the whole area of an EL layer is formed over the first electrode. FIG. 3A is a plan view of the light-emitting device.

FIG. 3B is a cross-sectional view taken along the line Y2-Z2 in FIG. 2A. In the light-emitting device illustrated in FIGS. 3A and 3B, the sizes of EL layers 792a, 792b, and 792c are smaller than those of the first electrode layers 751a, 751b, and 751c; thus, the whole areas of the EL layers 792a, 792b, and 792c are formed over the first electrode layers 751a, 751b, and 751c, respectively.

By a deposition method of the present invention, a film is deposited onto the deposition target substrate, reflecting a pattern of the light-absorbing layer selectively formed over the deposition substrate. Thus, when the pattern of the material layer formed over the light-absorbing layer is set to be smaller than the first electrode layers 751a, 751b, and 751c, films can be deposited in shapes like those of the EL layers 792a, 792b, and 792c.

Further, in the passive matrix light-emitting device, a partition wall (an insulating layer) for separating the light-emitting elements may be provided. An example of a light-emitting device having a partition wall having two layers is illustrated in FIGS. 5A and 5B and FIGS. 20A to 20G.

A method for manufacturing the light-emitting device of this embodiment mode illustrated in FIG. 5B, using a deposition method of the present invention will be described with reference to FIGS. 20A to 20G.

Figure 20A:
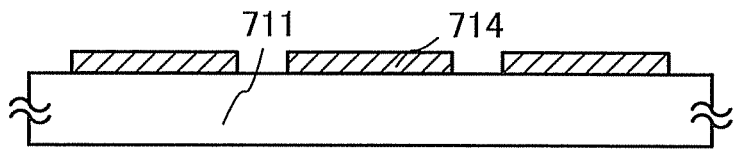
FIGS. 20A to 20G are cross-sectional views illustrating a manufacturing process of a light-emitting device of the present invention.
Figure 20B:
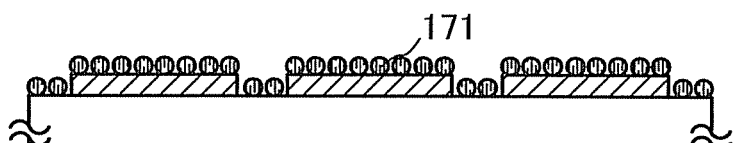

FIG. 20A illustrates a deposition substrate having a similar structure to that illustrated in FIG. 18A described in Embodiment Mode 2. The light-absorbing layer 714 is selectively formed over the first substrate 711 which is a deposition substrate.

The particles 171 containing an organic compound material are dispersed over the first substrate 711 and the light-absorbing layer 714 (see FIG. 6B).

Figure 20C:
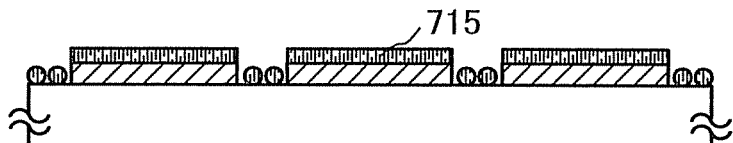

The particles 171 containing an organic compound material over the light-absorbing layer 704 are fixed by selective heat treatment, so that the material layer 715 is formed over the light-absorbing layer 714 (see FIG. 20C). Of the particles 171 containing an organic compound material deposited over (attached to) the first substrate 711 and the light-absorbing layer 714, only the particles 171 containing an organic compound material which are over the light-absorbing layer 714 are fixed by the heat treatment, so that the material layer 715 is formed. Thus, of the particles 171 containing an organic compound material which have been dispersed over the first substrate 711 and the light-absorbing layer 714, the particles 171 over the first substrate 711 remain particulate and are not fixed.

Figure 20D:
Figure 20E:
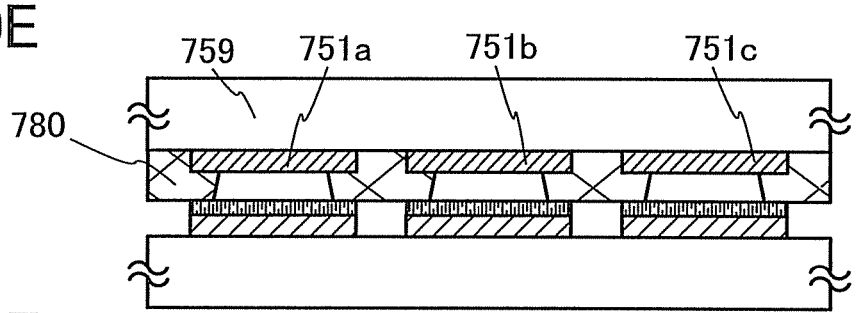

Next, of the particles 171 containing an organic compound material which have been dispersed over the first substrate 711 and the light-absorbing layer 714, the particles 171 over the first substrate 711 are removed (see FIG. 20D).

The first electrode layers 751a, 751b, and 751c are formed on the element substrate 759 which is a deposition target substrate. The element substrate 759 and the first substrate 711 are placed so that the first electrode layers 751a, 751b, and 751c and the partition wall 780 face the material layer 715 (see FIG. 20E). The first substrate 711 and the element substrate 759 are placed having the distance therebetween which is so short that the material layer 715 over the first substrate 711, which is the outermost surface and the partition wall 780 over the element substrate 759, which is the outermost surface are partially in contact with each other. As described above, in the case where the layers which are the outermost surfaces of the first substrate 711 and the element substrate 759 have unevenness, there is a region where the outermost surface layers are in contact and a region where they are not in contact in some cases.

Figure 20F:
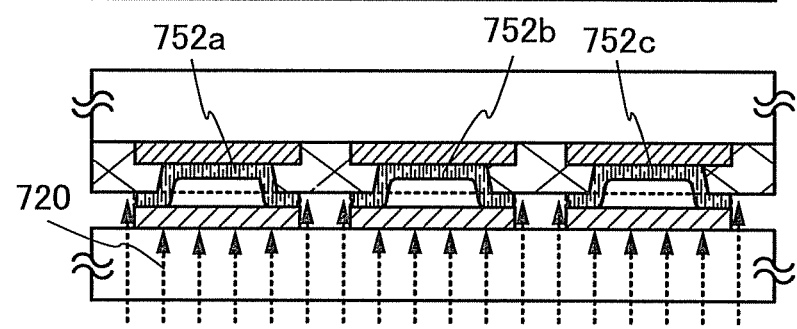

Irradiation with the light 710 is performed from the rear surface (the surface opposite to the surface over which the material layer 715 is formed) of the first substrate 711, so that at least a part of the material contained in the material layer 715 is deposited onto the element substrate 759 as the EL layers 752a, 752b, and 752c due to heat given by the light-absorbing layer 714 (see FIG. 20F). Through the above-described steps, the EL layers 752a, 752b, and 752c are selectively formed over the first electrode layers 751a, 751b, and 751c provided over the element substrate 759, respectively (see FIG. 20G). By reduction in the distance d, the shapes of the EL layers 752a, 752b, and 752c which are deposited onto the element substrate 759 can be formed with high accuracy at the time of light irradiation.

Figure 20G:
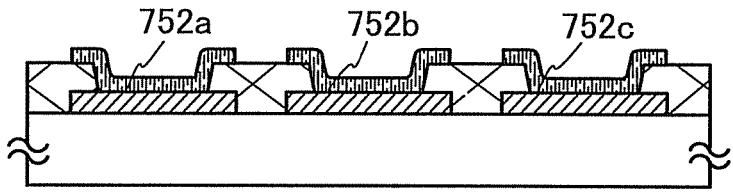

The second electrode layer 753b is formed over the EL layers 752a, 752b, and 752c illustrated in FIG. 20G, and sealing is performed using the sealing substrate 758, whereby the light-emitting device illustrated in FIG. 5B can be completed.

When the present invention is used, a thin film in a minute pattern can be formed on a deposition target substrate without providing a minute mask for separating pixels between the material and the deposition target substrate. As in this embodiment mode, a light-emitting element can be formed by such a deposition method, and accordingly a high-definition light-emitting device can be manufactured.

This embodiment mode can be combined with any of embodiment modes described above.

Embodiment Mode 7

In this embodiment mode, an active matrix light-emitting device manufactured using the present invention will be described with reference to FIGS. 11A and 11B.

Figure 11A:
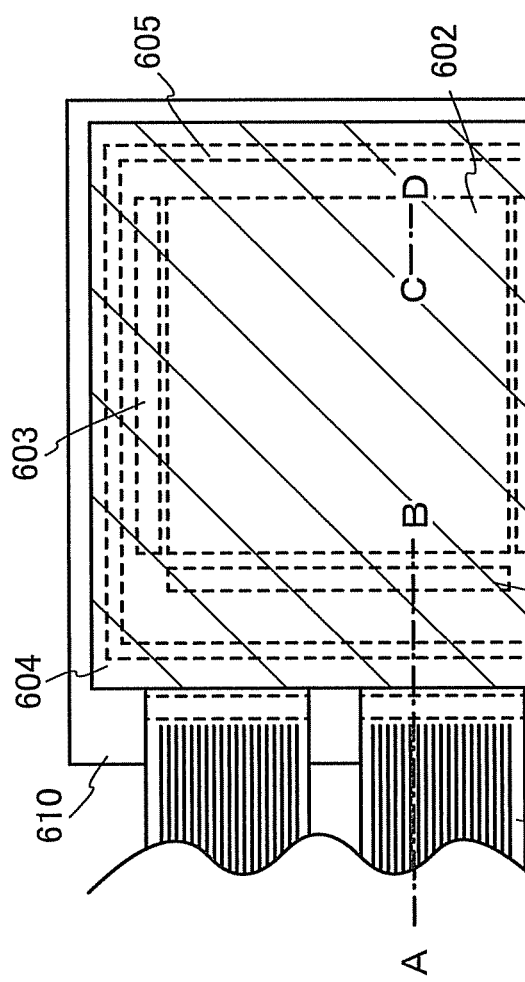
FIG. 11A is a plan view illustrating a light-emitting display module of the present invention and FIG. 11B is a cross-sectional view illustrating the same.
Figure 11B:
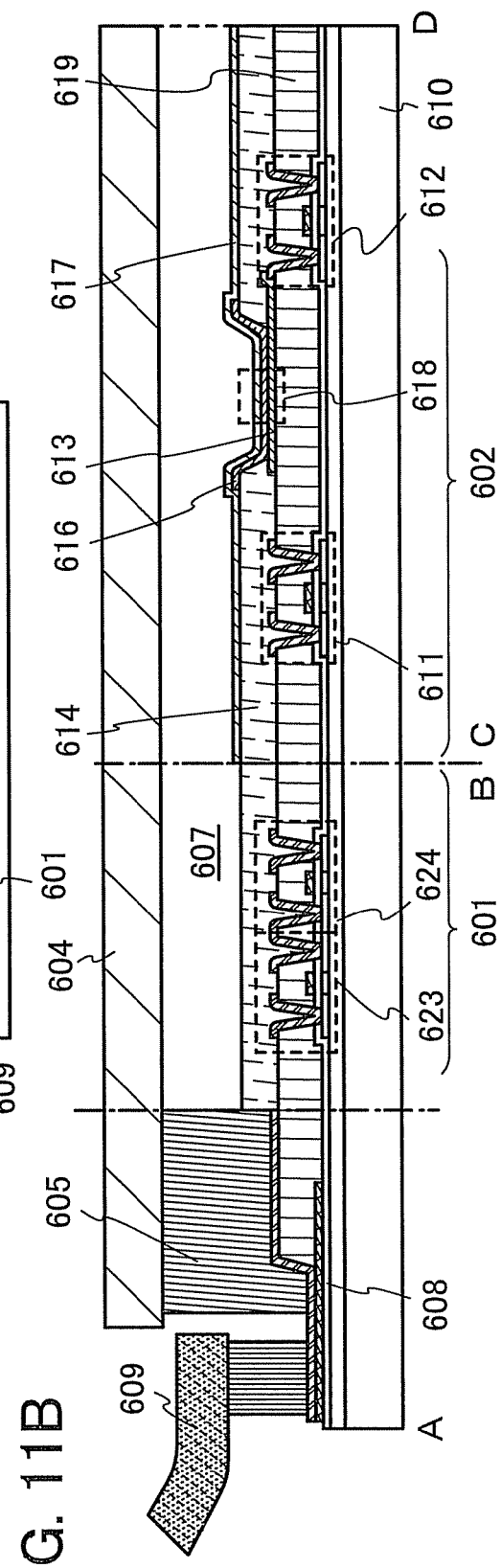

FIG. 11A is a plan view of a light-emitting device. FIG. 11B is a cross-sectional view taken along the lines A-B and C-D in FIG. 11A. Reference numerals 601, 602, and 603 denote a driver circuit portion (a source side driver circuit), a pixel portion, and a driver circuit portion (a gate side driver circuit), respectively, which are indicated by dotted lines. In addition, reference numerals 604 and 605 denote a sealing substrate and a sealing material, respectively. A portion surrounded by the sealing material 605 corresponds to a space 607.

A lead wiring 608 is a wiring for transmitting signals to the source side driver circuit 601 and the gate side driver circuit 603, and the wiring 608 receives video signals, clock signals, start signals, reset signals, or the like from a flexible printed circuit (FPC) 609 which serves as an external input terminal. Although only the FPC is illustrated here, the FPC may be provided with a printed wiring board (PWB). A light-emitting device in this specification includes not only a light-emitting device itself but also a light-emitting device with an FPC or a PWB attached thereto.

Next, a cross-sectional structure will be described with reference to FIG. 1B. The driver circuit portion and the pixel portion are formed over an element substrate 610. Here, the source driver circuit 601, which is the driver circuit portion, and one pixel in the pixel portion 602 are illustrated.

A CMOS circuit, which is a combination of an n-channel transistor 623 and a p-channel transistor 624, is formed for the source side driver circuit 601. The driver circuit may be formed using a variety of types of circuits, such as a CMOS circuit, a PMOS circuit, or an NMOS circuit. Although a driver-integration type device, in which a driver circuit is formed over a substrate, is illustrated in this embodiment mode, a driver circuit is not necessarily formed over the substrate and can be formed outside the substrate.

The pixel portion 602 has a plurality of pixels, each of which includes a switching transistor 611, a current-controlling transistor 612, and a first electrode 613 which is electrically connected to a drain of the current-controlling transistor 612. Note that an insulator 614 is formed so as to cover an edge of the first electrode 613. Here, a positive photosensitive acrylic resin film is used for the insulator 614. The first electrode 613 is formed over an insulating layer 619 which is an interlayer insulating layer.

The insulator 614 is formed so as to have a curved surface having curvature at an upper edge or a lower edge thereof in order to obtain favorable coverage. For example, in the case of using a positive photosensitive acrylic resin as a material for the insulator 614, the insulator 614 is preferably formed so as to have a curved surface with a curvature radius (0.2 μm to 3 μm) only at the upper edge thereof. Either a negative photoresist which becomes insoluble in an etchant by light irradiation or a positive photoresist which becomes soluble in an etchant by light irradiation can be used for the insulator 614.

Note that a structure of the transistor is not particularly limited. The transistor may have a single-gate structure in which one channel formation region is formed, a double-gate structure in which two channel formation regions are formed, or a triple-gate structure in which three channel formation regions are formed. In addition, the transistor in the peripheral driver circuit region may also have a single-gate structure, a double-gate structure, or a triple-gate structure.

The transistor can be employed in a top-gate structure (such as a staggered structure or a coplanar structure), a bottom-gate structure (such as an inverted staggered structure or an inverted coplanar structure), a dual-gate structure including two gate electrode layers provided above and below a channel region each with a gate insulating film interposed therebetween, or other structures.

Further, the crystallinity of a semiconductor used for forming the transistor is not particularly limited. The semiconductor layer can be formed using the following material: an amorphous semiconductor formed by a vapor growth method using a semiconductor material gas typified by silane or germane or a sputtering method, a polycrystalline semiconductor formed by crystallization of the amorphous semiconductor by utilization of light energy or thermal energy, a single crystal semiconductor, or the like.

Typical examples of an amorphous semiconductor include hydrogenated amorphous silicon, and typical examples of a crystalline semiconductor include polysilicon and the like. Examples of polysilicon (polycrystalline silicon) include so-called high-temperature polysilicon which contains polysilicon as a main component and is formed at a process temperature of greater than or equal to 800° C., so-called low-temperature polysilicon which contains polysilicon as a main component and is formed at a process temperature of less than or equal to 600° C., polysilicon obtained by crystallization of amorphous silicon by use of an element which promotes crystallization or the like, and the like. Instead of such a thin film process, an SOI substrate formed by provision of a single crystalline semiconductor layer on an insulating surface may be used. The SOI substrate can be formed by an SIMOX (separation by implanted oxygen) method or a Smart-Cut (registered mark) method. In the SIMOX method, oxygen ions are implanted into a single crystalline silicon substrate to form an oxygen-containing layer at a predetermined depth, and then heat treatment is performed to form an embedded insulating layer at a predetermined depth from the surface, thereby forming a single crystal silicon layer on the embedded insulating layer. In the Smart-Cut (registered mark) method, hydrogen ions are implanted into an oxidized single crystal silicon substrate to form a hydrogen-containing layer in a portion corresponding to a desired depth, the oxidized single crystal silicon substrate is attached to a supporting substrate (such as a single crystalline silicon substrate having a silicon oxide film for attachment on its surface), and heat treatment is performed. Accordingly, the single crystal silicon substrate is separated at the hydrogen-containing layer, and stacked layers of the silicon oxide film and the single crystalline silicon layer is formed on the supporting substrate.

An EL layer 616 and a second electrode 617 are formed over the first electrode 613. The EL layer 616 of a light-emitting element described in this embodiment mode can be formed by application of the deposition method described in Embodiment Mode 1 or 2.

The sealing substrate 604 and the element substrate 610 are attached to each other with the sealing material 605, whereby the light-emitting element 618 is provided in the space 607 surrounded by the element substrate 610, the sealing substrate 604, and the sealing material 605. Note that the space 607 is filled with a filler which can be either an inert gas (e.g., nitrogen or argon) or the sealing material 605.

As the sealing material 605, a visible light curable resin, a TV curable resin, or a thermosetting resin is preferably used. Specifically, an epoxy resin can be used. It is desirable that such a material transmit as little moisture or oxygen as possible. As the sealing substrate 604, a plastic substrate made of FRP (fiberglass-reinforced plastics), PVF (polyvinyl fluoride), polyester, acrylic, or the like can be used besides a glass substrate or a quartz substrate. Alternatively, a film (made of polypropylene, polyester, vinyl, polyvinyl fluoride, vinyl chloride, or the like), an inorganic film formed by evaporation, or the like can be used.

Further, an insulating layer may be provided as a passivation film (a protective film) over the light-emitting element. The passivation film can be formed as a single layer or a stacked layer of an insulating film containing silicon nitride, silicon oxide, silicon oxynitride, silicon nitride oxide, aluminum nitride, aluminum oxynitride, aluminum nitride oxide in which the amount of nitrogen is higher than that of oxygen, aluminum oxide, diamond-like carbon (DLC), or nitrogen-containing carbon. Alternatively, a siloxane resin may be used.

The space 607 may be filled with nitrogen or the like, instead of the filler, by being sealed in a nitrogen atmosphere. In the case where light is extracted from a light-emitting device through the filler, the filler also should have a light-transmitting property. For example, a visible light curable epoxy resin, a UV curable epoxy resin, or a thermosetting epoxy resin may be used for the filler. The filler may be dropped in a liquid state to fill the inside of the light-emitting device. When a hygroscopic substance such as a drying agent is used as the filler, or the filler is doped with a hygroscopic substance, a higher water absorbing effect can be achieved and deterioration of an element can be prevented.

In addition, with use of retardation films and/or a polarizing plate, reflected light of light incident from outside may be blocked. An insulating layer serving as a partition wall may be colored to be used as a black matrix. This partition can be formed by a droplet discharge method. Carbon black or the like may be mixed into a resin material such as polyimide, and a stack thereof may alternatively be used. By a droplet discharge method, different materials may be discharged to the same region plural times to form the partition wall. A quarter wave plate or a half wave plate may be used as the retardation plate and may be designed to be able to control light. As the structure, the element substrate, the sealing substrate (the sealing material), the retardation plates (a quarter wave plate ($\lambda/4$) and a half wave plate ($\lambda/2$)), and the polarizing plate are sequentially formed, and light emitted from the light-emitting element is transmitted therethrough and is emitted to an external portion from the polarizing plate side. The retardation film and the polarizing plate may be provided on a side through which light is transmitted through, or may be provided on both sides in the case of a dual emission light-emitting device in which light is emitted from the both sides. In addition, an anti-reflective film may be provided on the outer side of the polarizing plate. Accordingly, an image with higher resolution and precision can be displayed.

Although the active matrix light-emitting device is manufactured using the circuit as described above in this embodiment mode, the present invention is not limited thereto. An IC chip may be mounted by the above-described COG method or TAB method as a peripheral driver circuit. In addition, one or a plurality of gate line driver circuits and source line driver circuits may be provided.

In the light-emitting device of the present invention, a driving method for image display is not particularly limited. For example, a dot sequential driving method, a line sequential driving method, an area sequential driving method, or the like may be used. Typically, a line sequential driving method may be used, and a time division gray scale driving method and an area gray scale driving method may be used as appropriate. Further, a video signal input to the source line of the light-emitting device may be an analog signal or a digital signal. The driver circuit and the like may be designed as appropriate in accordance with the video signal.

Light-emitting layers having different light emission wavelength ranges may be each formed in pixels so as to perform color display. Typically, light-emitting layers corresponding to respective colors of R (red), G (green), and B (blue) are formed. Also in this case, color purity can be improved and a pixel region can be prevented from having a mirror surface (reflection) by provision of a filter which transmits light of the emission wavelength range on the light-emission side of the pixel. By provision of the filter, the loss of light emitted from the light-emitting layer can be eliminated. Furthermore, change in color tone, which occurs when a pixel region (a display screen) is obliquely seen, can be reduced.

When the present invention is used, a thin film in a minute pattern can be formed on a deposition target substrate without providing a minute mask for separating pixels between a material and the deposition target substrate. In addition, waster of material can be reduced to increase material use efficiency, and thus reduction in cost is possible. As in this embodiment mode, a light-emitting element can be formed by such a deposition method, and accordingly a high-definition light-emitting device can be manufactured.

This embodiment mode can be combined with any of embodiment modes described above.

Embodiment Mode 8

By application of the present invention, a variety of light-emitting devices having a display function can be manufactured. That is, the present invention can be applied to a variety of electronic devices in which those light-emitting devices having a display function are incorporated into display portions.

As such electronic devices of the present invention, the following can be given: television devices (also simply referred to as televisions or television receivers), cameras such as digital cameras or digital video cameras, mobile phone sets (also simply referred to as mobile phones or cellular phones), portable information terminals such as PDAs, portable game machines, monitors for computers, computers, audio reproducing devices such as car audio systems, image reproducing devices provided with a recording medium such as home game machines (specifically, a digital versatile disc (DVD)), and the like. Further, the present invention can be applied to any game machine having a display device, such as a pachinko machine, a slot machine, a pinball machine, and a large game machine. Specific examples thereof will be described with reference to FIGS. 12A to 12F, FIGS. 13A and 13B, and FIGS. 14A to 14C.

The applicable range of the light-emitting device of the present invention is so wide that the light-emitting device can be applied to electronic devices in a variety of fields. Since the deposition method of the present invention described in Embodiment Mode 1 or 2 is used, excellent material use efficiency and a highly fine pattern are obtained. Thus, an electronic device with high image quality, which has a large display portion or a lighting portion, can be provided at low cost.

Figure 12A:
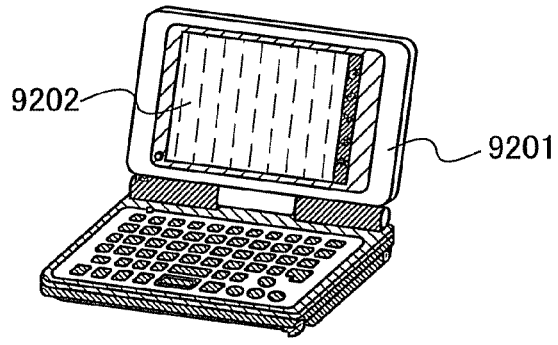
FIGS. 12A to 12F are diagrams illustrating electronic devices of the present invention.

A portable information terminal device illustrated in FIG. 12A includes a main body 9201, a display portion 9202, and the like. The light-emitting device of the present invention can be applied to the display portion 9202. As a result, a portable information terminal device with high image quality can be provided at low cost.

Figure 12B:
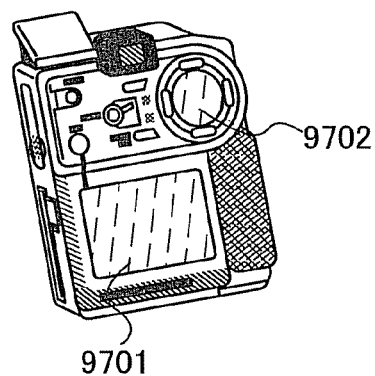

A digital video camera illustrated in FIG. 12B includes a display portion 9701, a display portion 9702, and the like. The light-emitting device of the present invention can be applied to the display portion 9701. As a result, a digital video camera with high image quality can be provided at low cost.

Figure 12C:
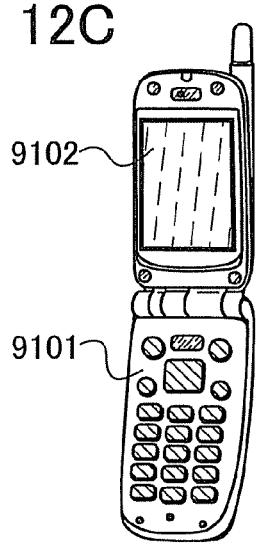

A cellular phone illustrated in FIG. 12C includes a main body 9101, a display portion 9102, and the like. The light-emitting device of the present invention can be applied to the display portion 9102. As a result, a cellular phone with high image quality can be provided at low cost.

Figure 14A:
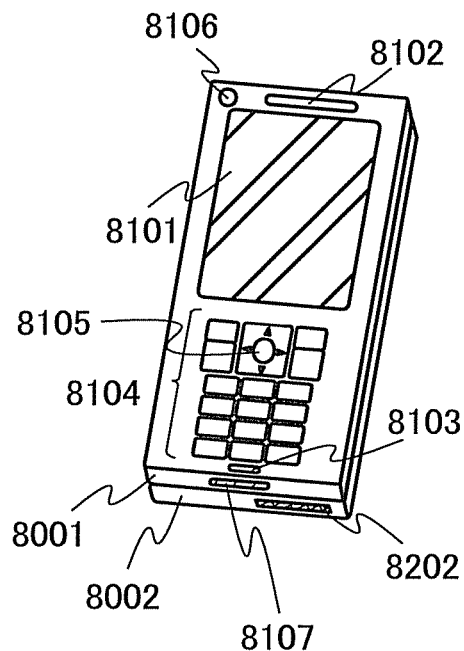
FIGS. 14A to 14C are diagrams illustrating an electronic device of the present invention.
Figure 14B:
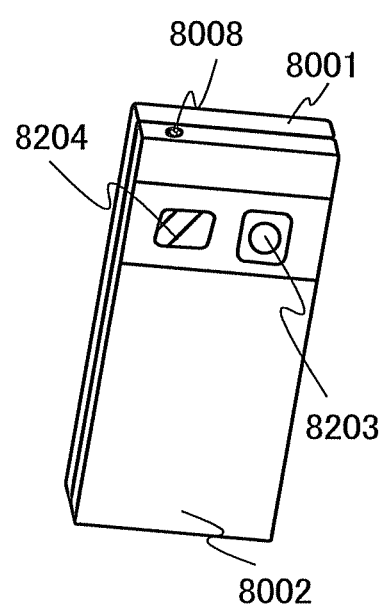
Figure 14C:
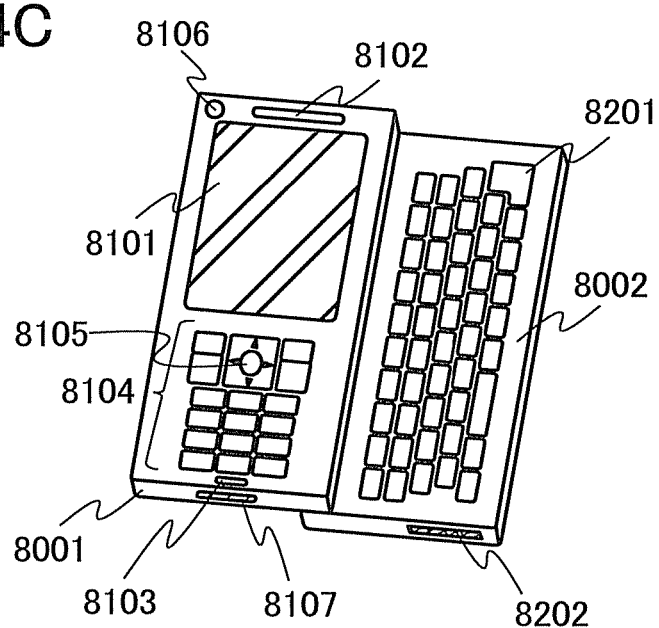

FIGS. 14A to 14C illustrate an example of a cellular phone to which the present invention is applied, which is different from the example of the cellular phone illustrated in FIG. 12C. FIG. 14A is a front view of the cellular phone, FIG. 14B is a rear view thereof, and FIG. 14C is a view illustrating the cellular phone which is slid open. The cellular phone is a so-called smartphone which has both functions of a cellular phone and a portable information terminal, and incorporates a computer and can process a variety of data processing in addition to voice calls.

The cellular phone has two housings 8001 and 8002. The housing 8001 includes a display portion 8101, a speaker 8102, a microphone 8103, operation keys 8104, a pointing device 8105, a camera lens 8106, an external connection terminal 8107, an earphone terminal 8108, and the like, while the housing 8002 includes a keyboard 8201, an external memory slot 8202, a camera lens 8203, a light 1204, and the like. In addition, an antenna is incorporated in the housing 8001.

In addition to the above-described structure, a wireless IC ship, a small-size memory device, or the like can be built therein.

The display direction of the display portion 8101 which is capable of incorporating the light-emitting device described in another embodiment mode described above changes according to usage patterns. The cellular phone is provided with the camera lens 8106 on the same surface as the display portion 8101, and thus it can be used as a video phone. A still image and a moving image can be shot with use of the display portion 8101 as a viewfinder, the camera lens 8203, and the light 8204. The speaker 8102 and the microphone 8103 are not limited to use for verbal communication, and can be used for a videophone, recording, reproduction, and the like. The operation keys 8104 are capable of being used for incoming and outgoing calls, simple input of information such as e-mail, scroll of a screen, cursor motion, and the like. Furthermore, the housing 8001 and the housing 8002 overlapping with each other illustrated in FIG. 14A can be slid open as shown in FIG. 14C, so that the cellular phone can be used as a mobile information terminal. In this case, smooth operation is possible with use of the keyboard 8201 and the pointing device 8105. The external connection terminal 8107 can be connected to an AC adapter or a variety of cables such as a USB cable, and can be charged and perform data communication with a computer or the like. Moreover, a recording medium is inserted in the external memory slot 8202, so that the cellular phone can handle storage and movement of a large amount of data.

Further, the cellular phone may be equipped with an infrared communication function, a television receiving function, and the like, in addition to the above-described functions.

Since the light-emitting device of the present invention can be applied to the display portion 8101, a cellular phone with high image quality can be provided at low cost.

Figure 12D:
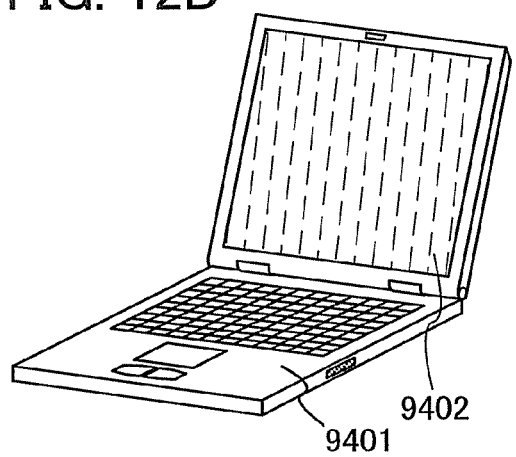

A portable computer illustrated in FIG. 12D includes a main body 9401, a display portion 9402, and the like. The light-emitting device of the present invention can be applied to the display portion 9402. As a result, a portable computer with high image quality can be provided at low cost.

Figure 12E:
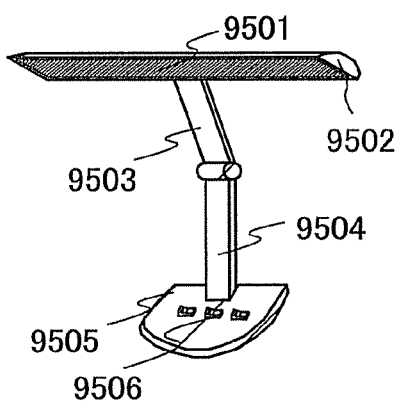

The light-emitting device to which the present invention is applied can also be used as a small desk lamp or a large room lighting device. FIG. 12E illustrates a desk lamp including a lighting portion 9501, a shade 9502, an adjustable arm 9503, a support 9504, a base 9505, and a power supply 9506. The desk lamp is manufactured using the light-emitting device of the present invention for the lighting portion 9501. Note that a lamp includes a ceiling light, a wall light, and the like in its category. The present invention enables large lighting equipment to be provided at low cost.

Furthermore, the light-emitting device of the present invention can also be used as a backlight of a liquid crystal display device. The light-emitting device of the present invention is a plane-emission light-emitting device and can be formed to have a large area; thus, the area of a backlight can be increased and the area of a liquid crystal display device can also be increased. Further, since the light-emitting display device of the present invention is thin, a liquid crystal display device can be made thin.

Figure 12F:
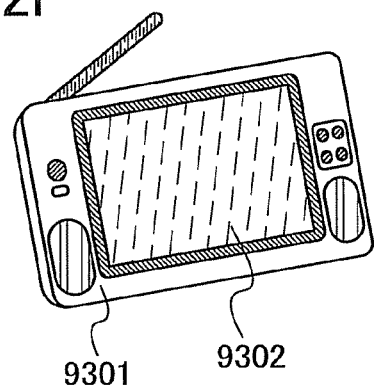

A portable television device illustrated in FIG. 12F includes a main body 9301, a display portion 9302, and the like. The light-emitting device of the present invention can be applied to the display portion 9302. As a result, a portable television device with high image quality can be provided at low cost. The light-emitting device of the present invention can be widely applied to a variety of television sets such as a small size one incorporated in a portable terminal such as a mobile phone set, a medium size one that is portable, and a large size one (e.g., 40 inches or more).

Figure 13A:
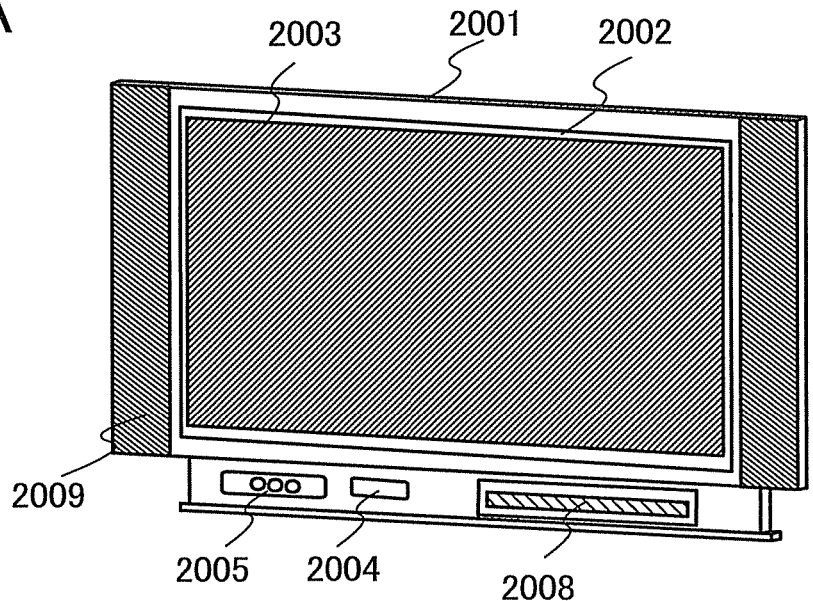
FIGS. 13A and 13B are diagrams illustrating electronic devices of the present invention.
Figure 13A:
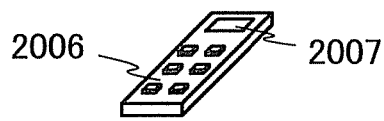

FIG. 13A illustrates a television device having a large display portion. A main screen 2003 is formed using the light-emitting device of the present invention, and a speaker portion 2009, an operation switch, and the like are provided as its accessory equipment.

As illustrated in FIG. 13A, a display panel 2002 using a light-emitting element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

Further, the television device may also include a sub screen 2008 formed using a second display panel so as to display channels, volume, or the like, in addition to the main screen 2003.

Figure 13B:
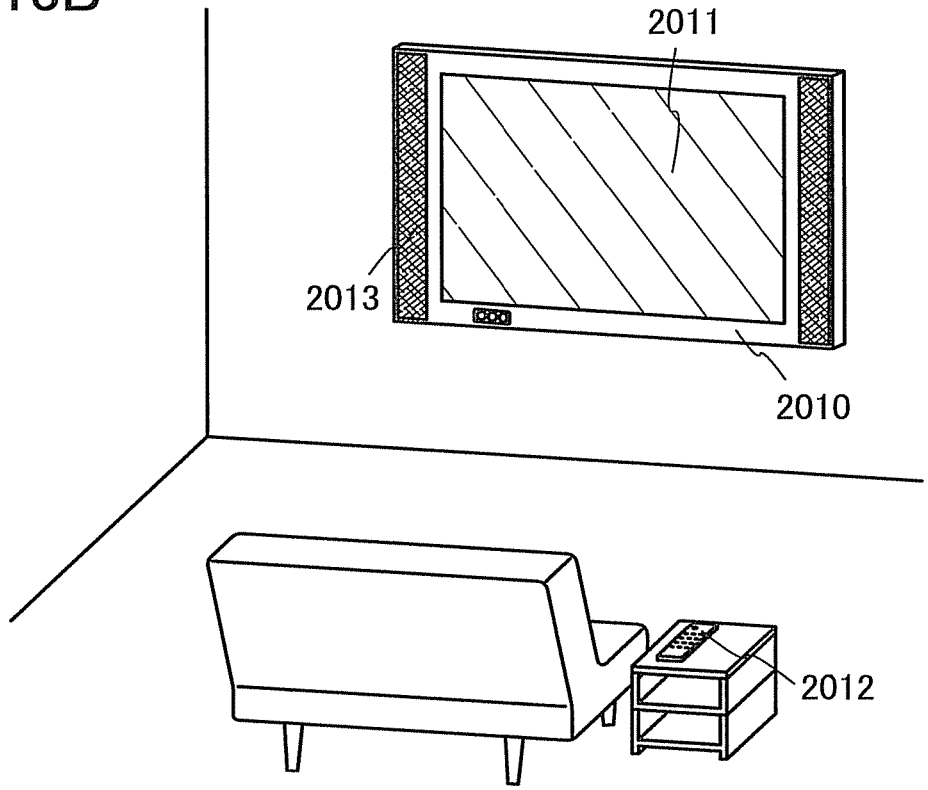

FIG. 13B illustrates a television device having a large display portion, for example, a 20-inch to 80-inch display portion. The television device includes a housing 2010, a display portion 2011, a remote control device 2012 which is an operation portion, a speaker portion 2013, and the like. The present invention is applied to manufacture of the display portion 2011. By application of the present invention, a large television device which has high image quality can be provided at low cost. In addition, since the television device illustrated in FIG. 13B is a wall-hung television device, it does not need a large installation space.

Needless to say, the present invention can be applied to a variety of applications such as a large-area display media like information display boards in railway stations, airports, and the like or advertisement display boards on the street.

This embodiment mode can be combined with any of embodiment modes described above.

Embodiment 1

Figure 16A:
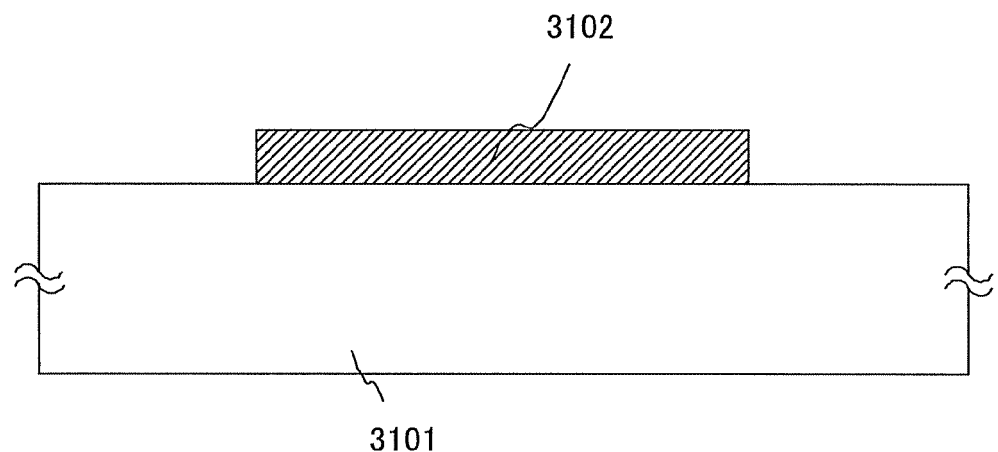
FIGS. 16A and 16B are views illustrating Embodiment 1.
Figure 17A:
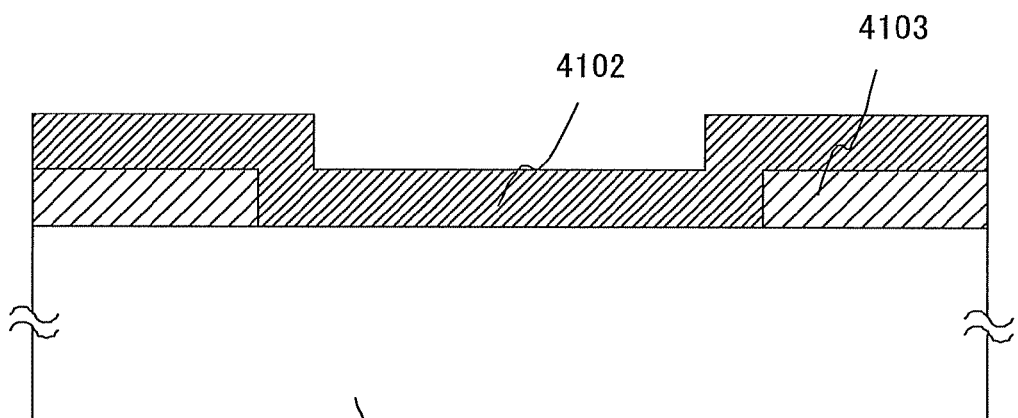
FIGS. 17A and 17B are views illustrating a comparative example in Embodiment 1.

In this embodiment, calculation was performed on heat distribution of a deposition substrate used for a deposition method of the present invention when the deposition substrate is irradiated with laser light. FIG. 16A and FIG. 17A illustrate models used for the calculation. Note that the calculation was performed using the models as two-dimensional models.

The model illustrated in FIG. 16A is a deposition substrate used for a deposition method of the present invention. A two-dimensional model in which a light-absorbing layer 3102 (a 100-nm-thick titanium film was stacked over a 100-nm-thick titanium nitride film) was formed over a glass substrate 3101 (thickness: 0.7 mm) was employed. Note that the width of the light-absorbing layer 3102 was set at 21.5 μm.

The model illustrated in FIG. 17A is a comparison deposition substrate used for comparison. A two-dimensional model in which 200-nm-thick aluminum (Al) as a reflective layer 4103 and 200-nm-thick titanium (Ti) as a light-absorbing layer 4102 were stacked over a glass substrate 4101 (thickness: 0.7 mm) was employed. Note that the width of an opening of the reflective layer 4103 was set at 21.5 μm.

The calculation conditions are described below.
Calculation tool: ANSYS
Mesh to be used: three-node triangle free mesh
Minimum mesh length: 0.05 μm
Nonlinear analysis (Newton's method) was used due to dependence of thermal conduction characteristics on temperature.
Tolerance for nonlinear convergence: L2 norm, less than or equal to $1.0\ e^{-4}$
Substrate transfer speed: 1000 mm/sec
Laser power: 12 W
Size of laser spot: 10 mm×1000 mm
Light absorptance of light-absorbing layer: 64.9%
Time interval in nonstationary analysis: 0.125 μs In the case where a thin film formed using 0.7-mm-thick glass and 200-nm-thick titanium was irradiated with laser light with a wavelength of 532 nM, a result that 64.96% of the laser energy was absorbed was obtained by a MATRIX method which is one of optical calculation methods. If all the absorbed laser energy is converted into a calorific value, the following expression is obtained:

$$\text{Calorific value per unit time} = (\text{laser energy per unit time}) \times 0.6496$$

The calorific value was distributed uniformly in the volume over a region of titanium which generates heat by laser irradiation. Table 1 shows the parameters used for the calculation.

The initial temperature was 27° C., which was uniform, and the boundary conditions were all heat insulation boundary. For calculation convergence, the lowest point of the glass substrate was fixed to 27° C.

TABLE 1

| Al | | | | | | |
|---|---|---|---|---|---|---|
| Temperature | [° C.] | 25.15 | 127 | 227 | 327 | 527 |
| Specific Heat | [J/gK] | 0.5227 | 0.5542 | 0.5733 | 0.5904 | 0.632 |
| Temperature | [° C.] | 27 | 127 | 427 | | |
| Degree of Heat Conductivity | [J/smK] | 21.9 | 20.4 | 19.4 | | |
| Temperature | [° C.] | 27 | 2000 | | | |
| Density | [g/m$^3$] | 4.51E+06 | 4.51E+06 | | | |

| Ti (TiN) | | | | | | | |
|---|---|---|---|---|---|---|---|
| Temperature | [° C.] | 25.15 | 127 | 227 | 327 | 527 | 727 |
| Specific Heat | [J/gK] | 0.5993 | 0.7081 | 0.7606 | 0.7875 | 0.8182 | 0.8429 |
| Temperature | [°C.] | 25 | 127 | 200 | 650 | 1000 | |
| Degree of Heat Conductivity | [J/smK] | 8.84 | 28.83 | 16.72 | 11.29 | 8.36 | |
| Temperature | [° C.] | 27 | 2000 | | | | |
| Density | [g/m$^3$] | 5.43E+06 | 5.43E+06 | | | | |

Figure 16B:
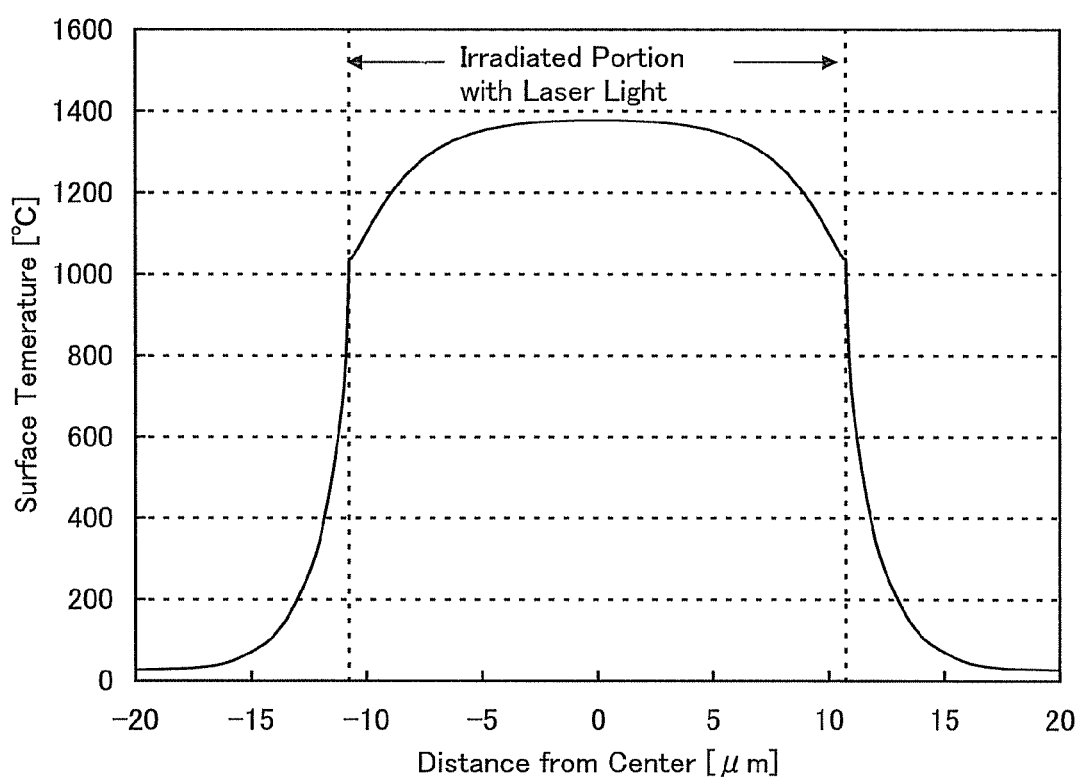
Figure 17B:
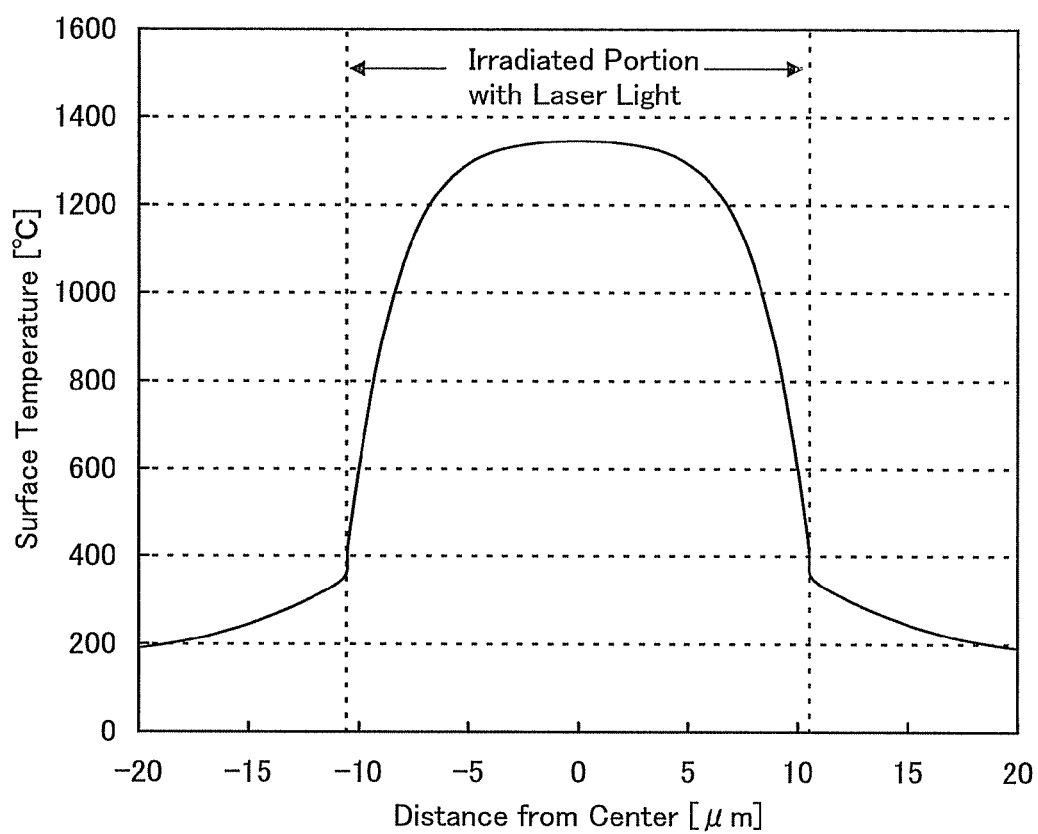

FIG. 16B and FIG. 17B show calculation results. FIG. 16B and FIG. 17B show surface temperatures upon termination of the laser light irradiation (irradiation time: 10 ns). Note that unlike a three-dimensional model, the two-dimensional model is a model in which heat is not diffused perpendicularly to the paper plane, and thus calculated temperatures of the two-dimensional model tend to be higher than actual temperatures.

The low temperature gradient region of the light-absorbing layer in the model illustrated in FIG. 16A in which a reflective layer is not provided is smaller and the high temperature region distribution thereof is wider than in the comparison model illustrated in FIG. 17A. In the comparison model illustrated in FIG. 17A, heat was diffused in a lateral direction (plane direction), whereas in the structure illustrated in FIG. 16A, heat was blocked and stored in the light-absorbing layer. Therefore, as for the model illustrated in FIG. 16A, the temperature gradient in the light-absorbing layer is small and difference in temperature between the light-absorbing layer and the outside is obvious. That is, the temperatures vary markedly between a transfer portion in which the light-absorbing layer is formed and a non-transfer portion in which the light-absorbing layer is not formed, and thus deformation of a deposition pattern can be suppressed more than in the comparison model. Thus, application of the deposition substrate used for a deposition method of the present invention makes it possible to manufacture a light-emitting device with higher definition.

This application is based on Japanese Patent Application serial No. 2008-057356 filed with Japan Patent Office on Mar. 7, 2008, the entire contents of which are hereby incorporated by reference.

What is claimed is:

1. A deposition method comprising the steps of:
   selectively forming a light-absorbing layer having a pattern over a first substrate;
   dispersing particles containing an organic compound material over and in contact with the first substrate and the light-absorbing layer having the pattern;
   fixing the particles at least onto the light-absorbing layer having the pattern by heat treatment;
   disposing the first substrate and a second substrate so that a surface of the first substrate over which the light-absorbing layer having the pattern is formed and a deposition target surface of the second substrate face each other; and
   irradiating the light-absorbing layer having the pattern with light which is transmitted through the first substrate so that the organic compound material is deposited onto the deposition target surface of the second substrate.

2. The deposition method according to claim 1, wherein heat treatment on the particles over the light-absorbing layer having the pattern is performed by light irradiation.

3. The deposition method according to claim 1, wherein heat treatment on the particles is performed in a nitrogen or rare gas atmosphere.

4. The deposition method according to claim 1, wherein the particles which have not been fixed are removed from the first substrate and are collected.

5. The deposition method according to claim 1, wherein the second substrate is placed above the first substrate.

6. The deposition method according to claim 1, wherein the step of irradiating the light-absorbing layer having the pattern with light is performed under reduced pressure.

7. The deposition method according to claim 1, wherein the light-absorbing layer having the pattern remains over the first substrate when the organic compound material is deposited onto the deposition target surface of the second substrate.

8. The deposition method according to claim 1, wherein the light-absorbing layer having the pattern has a reflectance of less than or equal to 70% with respect to irradiation light.

9. The deposition method according to claim 1, wherein the light-absorbing layer having the pattern has a stacked-layer structure of metal and metal nitride.

10. The deposition method according to claim 1, wherein the organic compound material is deposited in a pattern reflecting the pattern of the light-absorbing layer onto the deposition target surface of the second substrate.

11. The deposition method according to claim 1, wherein the particles contacting with the first substrate remain over the first substrate when the organic compound material over the light-absorbing layer having the pattern is deposited onto the deposition target surface of the second substrate.

12. A method for manufacturing a light-emitting device,
wherein the deposition method according to claim 1 is used, and
wherein the organic compound material is deposited onto a first electrode formed on the deposition target surface of the second substrate.

13. A deposition method comprising the steps of:
selectively forming a light-absorbing layer having a pattern over a first substrate;
dispersing particles containing an organic compound material over and in contact with the first substrate and the light-absorbing layer having the pattern;
fixing the particles onto the light-absorbing layer having the pattern by heat treatment to form a material layer over the light-absorbing layer having the pattern;
disposing the first substrate and a second substrate so that a surface of the first substrate over which the material layer is formed and a deposition target surface of the second substrate face each other;
irradiating the light-absorbing layer having the pattern with light which is transmitted through the first substrate; and
depositing at least a part of the material layer over the light-absorbing layer having the pattern irradiated with the light onto the deposition target surface of the second substrate.

14. The deposition method according to claim 13, wherein heat treatment on the particles over the light-absorbing layer having the pattern is performed by light irradiation.

15. The deposition method according to claim 13, wherein heat treatment on the particles is performed in a nitrogen or rare gas atmosphere.

16. The deposition method according to claim 13, wherein the particles which have not been fixed are removed from the first substrate and are collected.

17. The deposition method according to claim 13, wherein the second substrate is placed above the first substrate.

18. The deposition method according to claim 13, wherein the step of irradiating the light-absorbing layer having the pattern with light is performed under reduced pressure.

19. The deposition method according to claim 13, wherein the light-absorbing layer having the pattern remains over the first substrate when the part of the material layer is deposited onto the deposition target surface of the second substrate.

20. The deposition method according to claim 13, wherein the light-absorbing layer having the pattern has a reflectance of less than or equal to 70% with respect to irradiation light.

21. The deposition method according to claim 13, wherein the light-absorbing layer having the pattern has a stacked-layer structure of metal and metal nitride.

22. The deposition method according to claim 13, wherein the light-absorbing layer having the pattern gives a heat to the material layer.

23. The deposition method according to claim 13, wherein the material layer is deposited in a pattern reflecting the pattern of the light-absorbing layer onto the deposition target surface of the second substrate.

24. The deposition method according to claim 13, wherein the material layer over the light-absorbing layer having the pattern has a same pattern with the light-absorbing layer having the pattern.

25. A method for manufacturing a light-emitting device,
wherein the deposition method according to claim 13 is used, and
wherein at least the part of the material layer is deposited onto a first electrode formed on the deposition target surface of the second substrate.

26. A deposition method comprising the steps of:
selectively forming a light-absorbing layer having a pattern over a first substrate;
providing a mask so as to cover an edge of the first substrate;
dispersing particles containing an organic compound material over and in contact with the first substrate, the light-absorbing layer having the pattern, and the mask;
fixing the particles onto the light-absorbing layer having the pattern by heat treatment to form a material layer over the light-absorbing layer having the pattern;
removing and collecting the particles over the mask and the first substrate, the particles not being fixed;
disposing the first substrate and a second substrate so that a surface of the first substrate over which the material layer is formed and a deposition target surface of the second substrate face each other;
irradiating the light-absorbing layer having the pattern with light which is transmitted through the first substrate; and
depositing at least a part of the material layer over the light-absorbing layer having the pattern irradiated with the light onto the deposition target surface of the second substrate.

27. The deposition method according to claim 26, wherein heat treatment on the particles over the light-absorbing layer having the pattern is performed by light irradiation.

28. The deposition method according to claim 26, wherein heat treatment on the particles is performed in a nitrogen or rare gas atmosphere.

29. The deposition method according to claim 26, wherein the second substrate is placed above the first substrate.

30. The deposition method according to claim 26, wherein the step of irradiating the light-absorbing layer having the pattern with light is performed under reduced pressure.

31. The deposition method according to claim 26, wherein the light-absorbing layer having the pattern remains over the first substrate when the part of the material layer is deposited onto the deposition target surface of the second substrate.

32. The deposition method according to claim 26, wherein the light-absorbing layer having the pattern has a reflectance of less than or equal to 70% with respect to irradiation light.

33. The deposition method according to claim 26, wherein the light-absorbing layer having the pattern has a stacked-layer structure of metal and metal nitride.

34. The deposition method according to claim 26, wherein the light-absorbing layer having the pattern gives a heat to the material layer.

35. The deposition method according to claim 26, wherein only the edge of the first substrate is covered with the mask.

36. The deposition method according to claim 26, wherein the material layer is deposited in a pattern reflecting the pattern of the light-absorbing layer onto the deposition target surface of the second substrate.

37. The deposition method according to claim 26, wherein the material layer over the light-absorbing layer having the pattern has a same pattern with the light-absorbing layer having the pattern.

38. A method for manufacturing a light-emitting device,
wherein the deposition method according to claim 26 is used, and
wherein at least the part of the particles are deposited onto a first electrode formed on the deposition target surface of the second substrate.

* * * * *

UNITED STATES PATENT AND TRADEMARK OFFICE
CERTIFICATE OF CORRECTION

PATENT NO. : 8,840,972 B2  
APPLICATION NO. : 12/396636  
DATED : September 23, 2014  
INVENTOR(S) : Shunpei Yamazaki Page 1 of 1

It is certified that error appears in the above-identified patent and that said Letters Patent is hereby corrected as shown below:

In the Specification:

Column 14, Line 43; Change "YAC," to --YAG,--.

Column 21, Line 52; Change "iridium(II)" to --iridium(III)--.

Column 21, Line 64; Change "iridium(II)" to --iridium(III)--.

Column 21, Line 65; Change "iridium(IEI)" to --iridium(III)--.

Column 22, Line 10; Change "iridium(II)" to --iridium(III)--.

Column 22, Line 15; Change "europium(R)" to --europium(III)--.

Column 22, Line 37; Change "N,N,N',N'-triphenylanthracen" to --N,N,9- triphenylanthracen--.

Column 24, Line 58; Change "N,N-diphenyl" to --N,N'-diphenyl--.

Column 24, Line 61; Change "tiphenylamine" to --triphenylamine--.

Column 24, Line 66; Change "phenylainino" to --phenylamino--.

Column 25, Line 24; Change "(2-naphtlhyl)" to --(2-naphthyl)--.

Column 26, Line 18; Change "bis[5(p" to --bis[5-(p--.

Column 32, Line 51; Change "FIG. 19Q and" to --FIG. 19G, and--.

Column 34, Line 44; Change "FIG. 1B." to --FIG. 11B.--.

Column 36, Line 12; Change "TV curable" to --UV curable--.

Column 40, Line 57; Change "532 nM," to --532 nm,--.

Signed and Sealed this  
Seventeenth Day of March, 2015

Michelle K. Lee  
*Director of the United States Patent and Trademark Office*